(12) United States Patent
Han et al.

(10) Patent No.: US 11,882,688 B2
(45) Date of Patent: Jan. 23, 2024

(54) SEMICONDUCTOR MEMORY DEVICE AND METHOD FOR FABRICATING THE SAME

(71) Applicant: Samsung Electronics Co., Ltd., Suwon-si (KR)

(72) Inventors: Jung-Hoon Han, Hwaseong-si (KR); Je Min Park, Suwon-si (KR)

(73) Assignee: Samsung Electronics Co., Ltd., Suwoni-si (KR)

( * ) Notice: Subject to any disclaimer, the term of this patent is extended or adjusted under 35 U.S.C. 154(b) by 149 days.

(21) Appl. No.: 17/403,984

(22) Filed: Aug. 17, 2021

(65) Prior Publication Data

US 2022/0189962 A1 Jun. 16, 2022

(30) Foreign Application Priority Data

Dec. 11, 2020 (KR) .................. 10-2020-0172859

(51) Int. Cl.
*H10B 12/00* (2023.01)

(52) U.S. Cl.
CPC ......... *H10B 12/315* (2023.02); *H10B 12/033* (2023.02); *H10B 12/34* (2023.02)

(58) Field of Classification Search
CPC ......... H01L 27/10852; H01L 27/10855; H01L 27/10814; H01L 27/10823; H10B 12/033; H10B 12/0335; H10B 12/315; H10B 12/34
See application file for complete search history.

(56) References Cited

U.S. PATENT DOCUMENTS

| 9,871,093 | B2 | 1/2018 | Kim et al. |
| 10,720,435 | B2 | 7/2020 | Song et al. |
| 2012/0104559 | A1* | 5/2012 | Kim ............ H01L 23/585 257/618 |
| 2014/0134839 | A1* | 5/2014 | Kim ............ H10B 12/033 438/675 |
| 2016/0027743 | A1 | 1/2016 | Kakisaki |
| 2018/0158829 | A1* | 6/2018 | Song ............ H01L 23/528 |

FOREIGN PATENT DOCUMENTS

| KR | 100625395 B1 | | 9/2006 |
| KR | 20110071355 A | * | 6/2011 |
| KR | 20110071355 A | | 6/2011 |
| KR | 20120045461 A | | 5/2012 |
| KR | 20200068800 A | | 6/2020 |

* cited by examiner

*Primary Examiner* — Robert G Bachner
*Assistant Examiner* — Molly K Reida
(74) *Attorney, Agent, or Firm* — Myers Bigel, P.A.

(57) ABSTRACT

A semiconductor memory device comprises a substrate, first and second lower electrode groups on the substrate and including a plurality of first and second lower electrodes, respectively, and first and second support patterns on side walls of and connecting each of the first and second lower electrodes, respectively. The first lower electrodes include a first center lower electrode arranged within a hexagonal shape defined by first edge lower electrodes. The second lower electrodes include a second center lower electrode arranged within a hexagonal shape defined by second edge lower electrodes. The first center lower electrode is spaced apart from each of the first edge lower electrodes in different first to third directions. The first support pattern is immediately adjacent to the second support pattern. The first center lower electrode is spaced apart from the second center lower electrode in a fourth direction different from the first to third directions.

17 Claims, 20 Drawing Sheets

SEMICONDUCTOR MEMORY DEVICE AND METHOD FOR FABRICATING THE SAME

CROSS-REFERENCE TO RELATED APPLICATION

This application claims priority from Korean Patent Application No. 10-2020-0172859 filed on Dec. 11, 2020 in the Korean Intellectual Property Office, and all the benefits accruing therefrom under 35 U.S.C. 119, the contents of which in its entirety are herein incorporated by reference.

FIELD

The present disclosure relates to a semiconductor memory device and a method for fabricating the same, and more specifically, to a support pattern for components of a semiconductor memory device.

BACKGROUND

Semiconductor memory devices may be increasingly valuable in the electronics industry due to characteristics such as miniaturization, multifunctionality, and low fabricating cost. However, as the electronics industry continues to develop, higher integration of the semiconductor memory devices becomes more important.

Line widths of patterns of the semiconductor memory devices may be gradually decreased for higher integration of the semiconductor memory devices. However, as the miniaturization of patterns may require new exposure technologies, such as higher-cost exposure technologies and the like, higher integration of the semiconductor memory device has been increasingly difficult. Accordingly, research has been conducted on new integrated technologies. For example, in a DRAM memory device, a structure in which word lines are buried inside a semiconductor substrate is being studied.

SUMMARY

Aspects of the present disclosure provide a highly integrated semiconductor memory device.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of the present disclosure, there is provided a semiconductor memory device including a substrate, a first lower electrode group on the substrate and comprising a plurality of first lower electrodes, a second lower electrode group on the substrate and comprising a plurality of second lower electrodes, a first support pattern on side walls of each of the first lower electrodes and connecting each of the first lower electrodes, and a second support pattern on side walls of each of the second lower electrodes and connecting each of the second lower electrodes. The plurality of first lower electrodes include first edge lower electrodes arranged in a first hexagonal shape and a first center lower electrode that is centrally positioned within the first hexagonal shape. The plurality of second lower electrodes include second edge lower electrodes arranged in a second hexagonal shape and a second center lower electrode that is centrally positioned within the second hexagonal shape. The first center lower electrode is spaced apart from each of the first edge lower electrodes in first, second, and third directions that are different from each other. The first support pattern is immediately adjacent to the second support pattern. The first center lower electrode is spaced apart from the second center lower electrode in a fourth direction that is different from the first, second, and third directions.

According to another aspect of the present disclosure, there is provided a semiconductor memory device including a substrate comprising a cell region that includes a first region and a second region along a boundary of the first region, a plurality of support patterns on the first region of the cell region and spaced apart from each other, a dummy support pattern extending along the second region of the cell region, a plurality of lower electrodes on the first region of the cell region, wherein respective subsets of the lower electrodes are connected by each of the support patterns, and a plurality of dummy lower electrodes on the second region of the cell region of the substrate and connected by the dummy support pattern, wherein the support patterns are arranged in a honey-comb structure.

According to another aspect of the present disclosure, there is provided a semiconductor memory device including a substrate, a plurality of lower electrodes on the substrate, and a plurality of support patterns connected to the lower electrodes. The plurality of lower electrodes includes a first lower electrode line and a second lower electrode line extending in a first direction. Each of the first and second lower electrode lines are adjacent to each other in a second direction different from the first direction, wherein one of the lower electrodes of the second lower electrode line is offset in the second direction with respect to one of the lower electrodes of the first lower electrode line. The plurality of support patterns includes a first support pattern line extending in a third direction different from the first direction and the second direction.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF EMBODIMENTS

Figure 1:
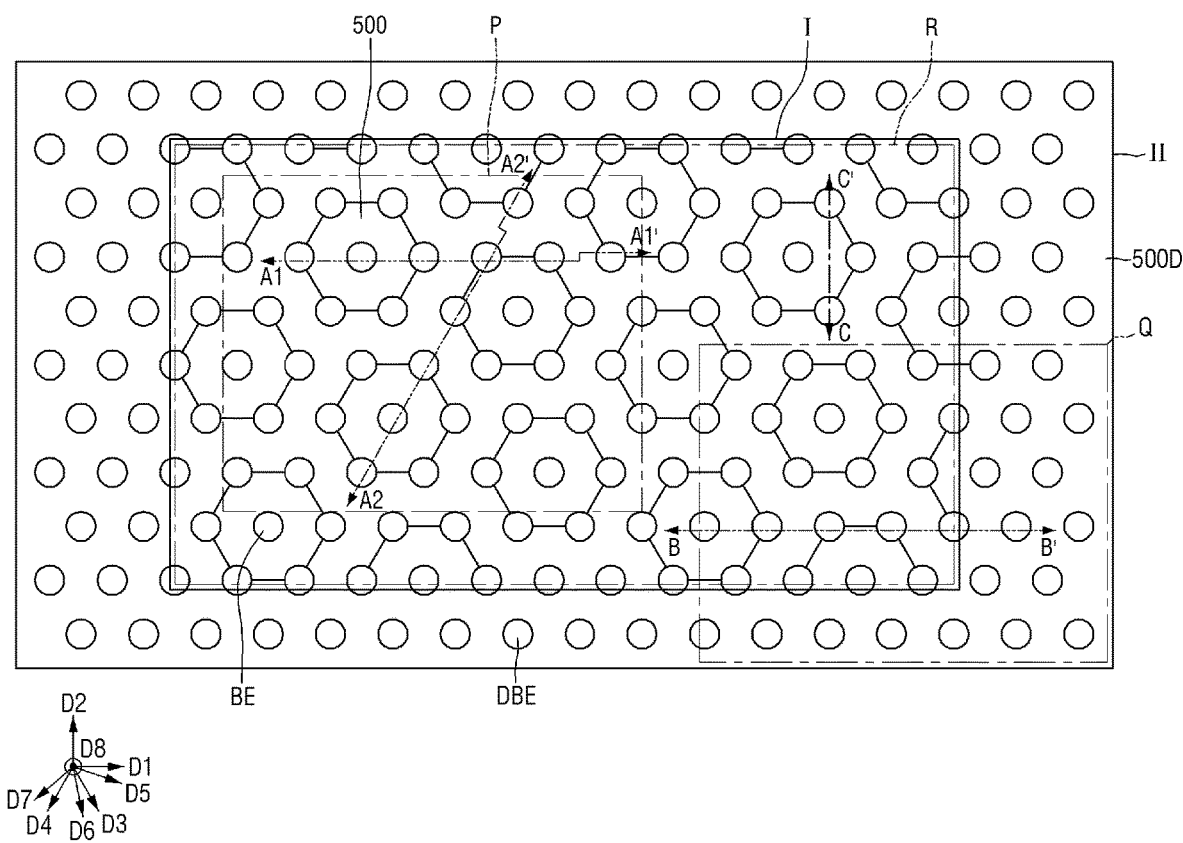
FIG. 1 is a plan view illustrating a semiconductor memory device according to some embodiments of the present disclosure.

Hereinafter, a semiconductor memory device according to some embodiments of the present disclosure will be described referring to FIGS. 1 to 8. The attached drawings may not necessarily be shown at a fixed ratio, and in some embodiments, a proportion of at least some of the structures shown in the drawings may be exaggerated to clearly show the characteristics of the embodiments.

In the drawings of the semiconductor device according to some embodiments of the present disclosure, although a DRAM (Dynamic Random Access Memory) is shown as an example semiconductor memory device, embodiments of the present disclosure are not limited thereto, and may be applied to other semiconductor memory devices.

Figure 2:
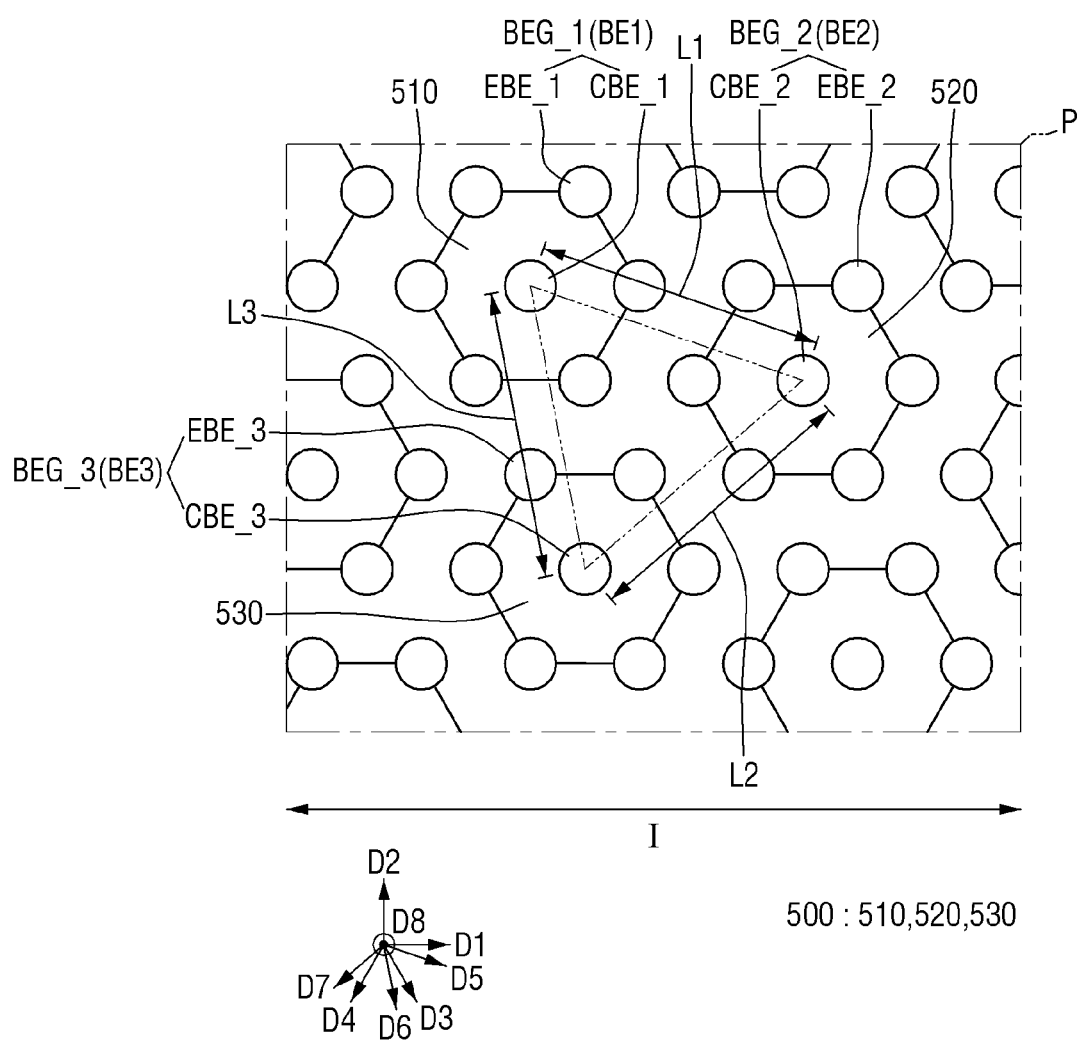
FIG. 2 is an enlarged view of a region P of FIG. 1.
Figure 3A:
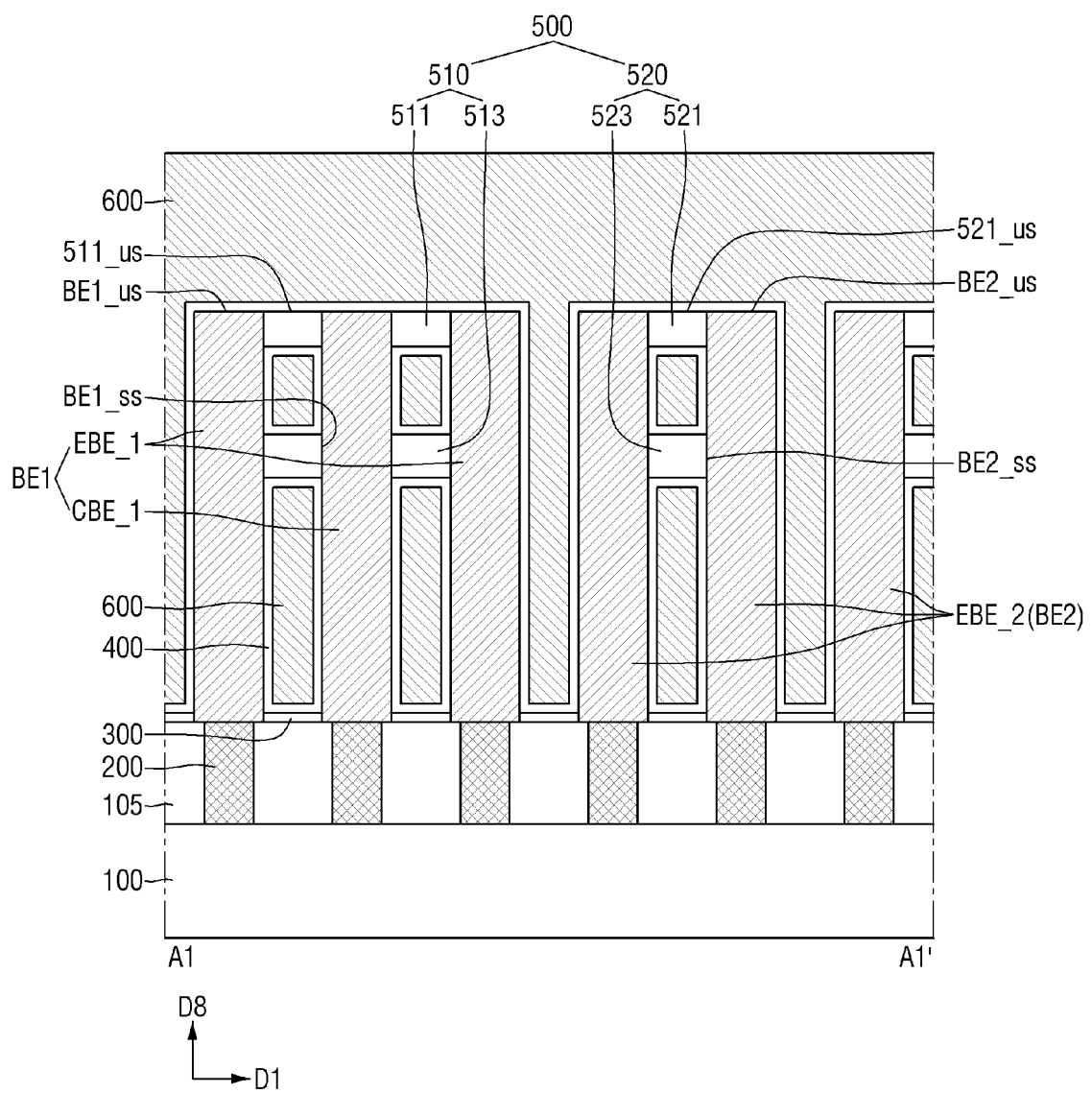
FIGS. 3A and 3B are cross-sectional views taken along A1-A1' of FIG. 1.
Figure 3B:
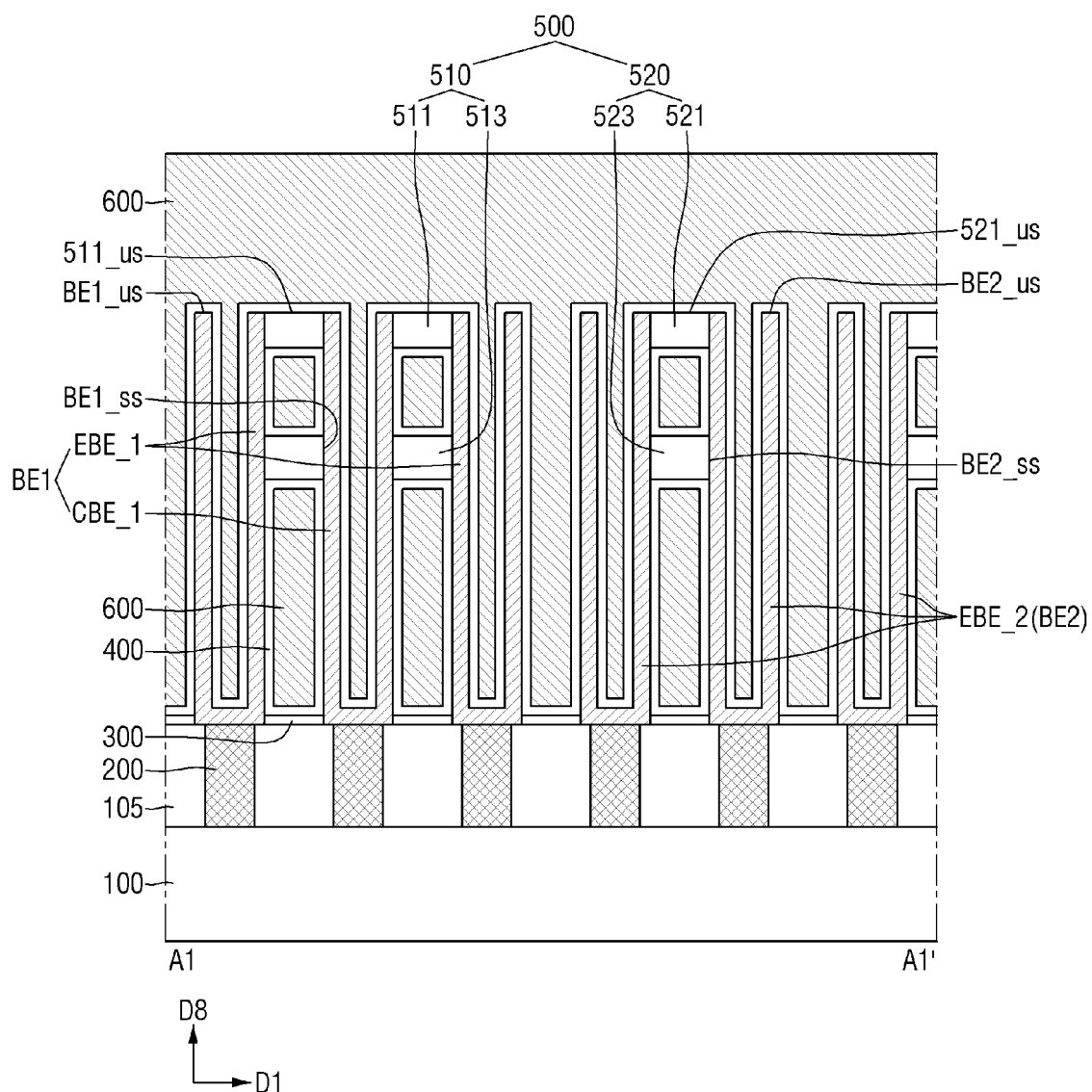
Figure 4A:
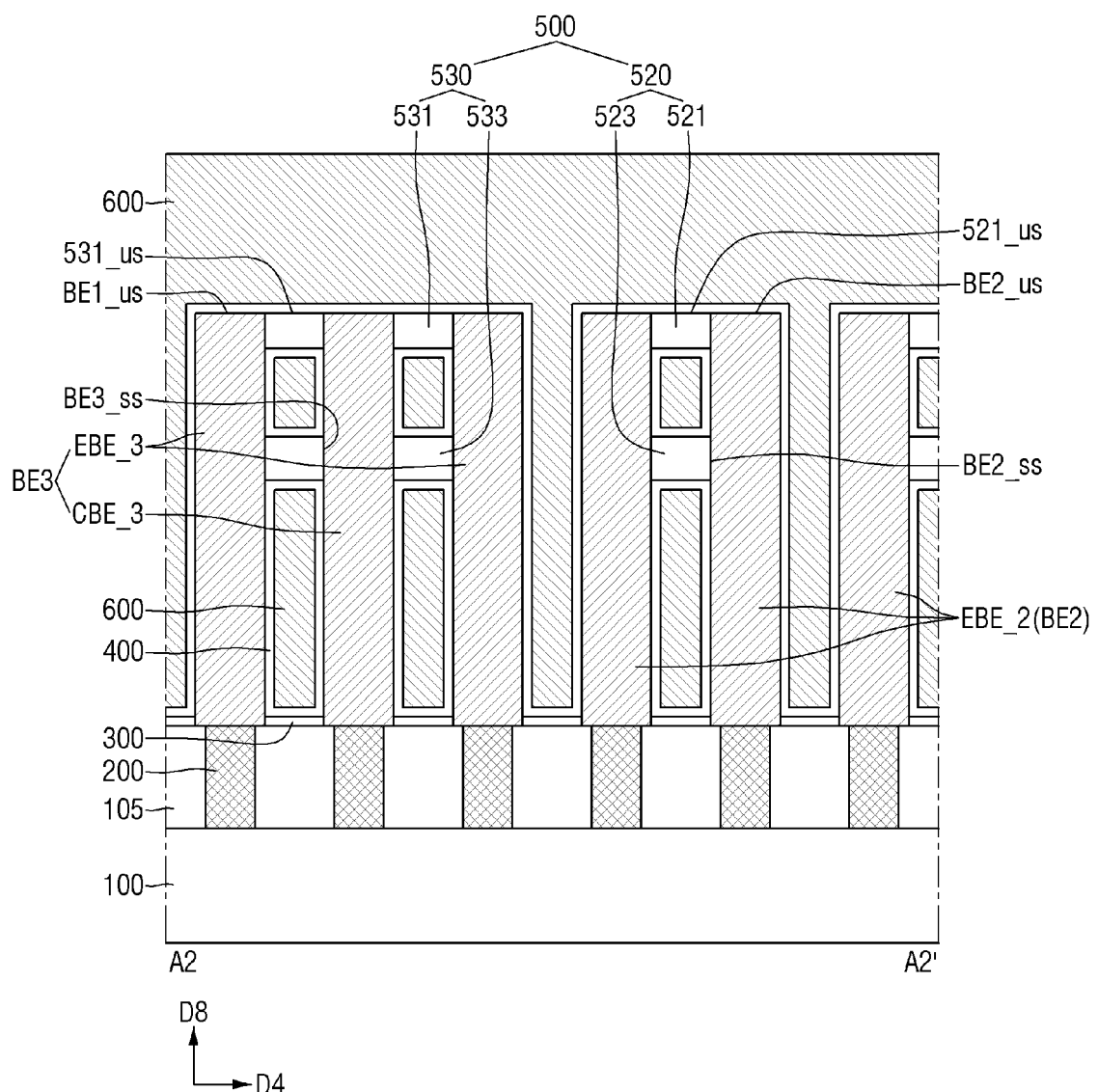
FIGS. 4A and 4B are cross-sectional views taken along A2-A2' of FIG. 1.
Figure 4B:
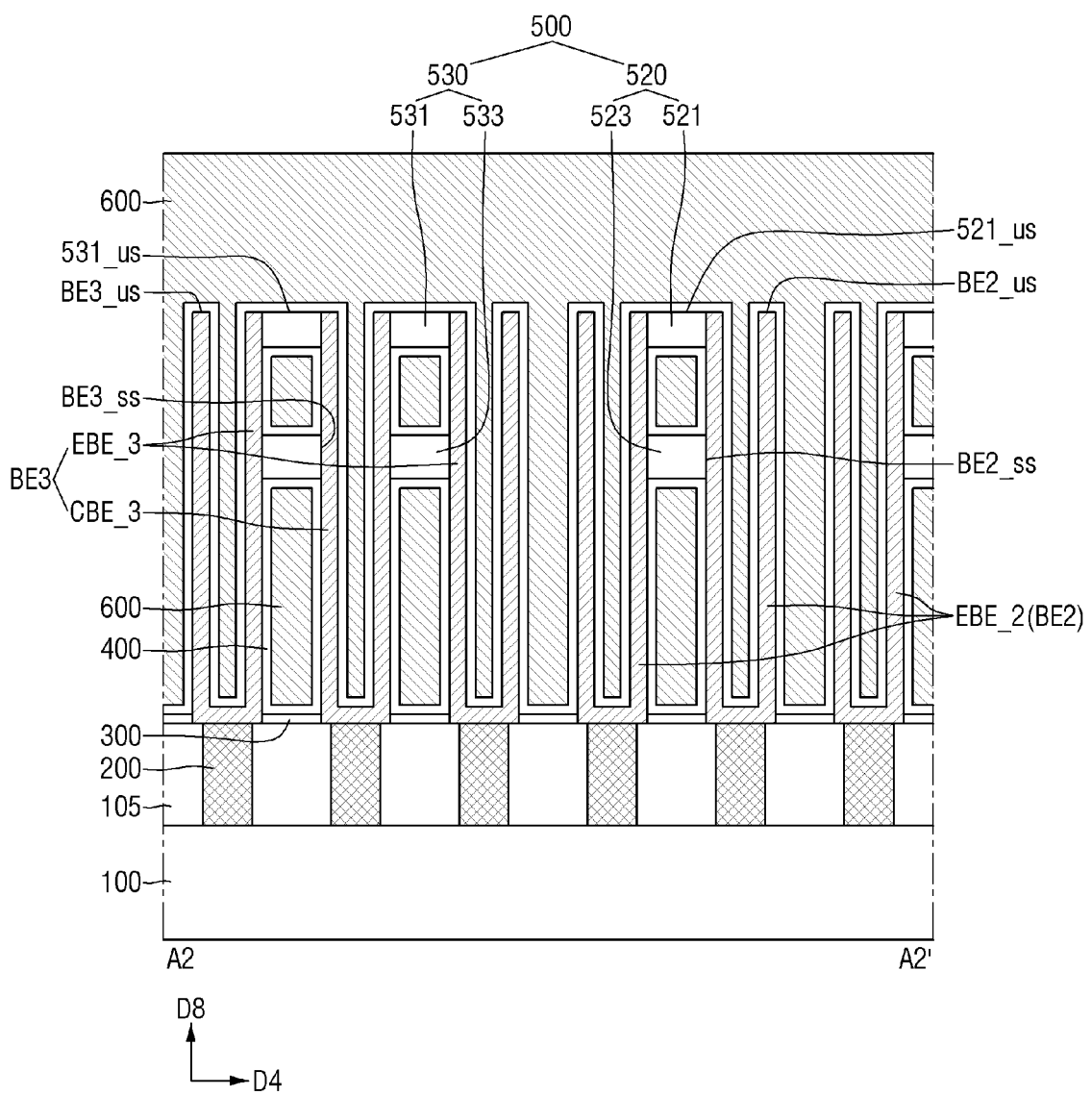

FIG. 1 is a plan view for explaining a semiconductor memory device according to some embodiments of the present disclosure. FIG. 2 is an enlarged view of a region P of FIG. 1. FIGS. 3A and 3B are cross-sectional views taken along A1-A1' of FIG. 1. FIGS. 4A and 4B are cross-sectional views taken along A2-A2' of FIG. 1.

Referring to FIGS. 1 to 4B, a substrate 100 is provided. The substrate 100 may include a cell region. The cell region may include a second region II, and a first region I within a boundary of the second region II. That is, the second region II may be placed around or may extend along a boundary of the first region I. The terms first, second, etc. may be used herein merely to distinguish one element or region from another.

In some embodiments, the semiconductor memory device may include a dummy support pattern 500D that extends along the second region II of the cell region. A plurality of support patterns 500 are placed or arranged on or within the first region I of the cell region and spaced apart from each other. The second region II may surround the first region I.

The support patterns 500 may be arranged in a honey-comb structure from a planar viewpoint, i.e., in plan view. That is, the support patterns 500 may each have a hexagonal shape. For convenience of explanation, although the support patterns 500 are shown as having a regular hexagonal shape from a planar viewpoint, embodiments are not limited thereto. Side walls of the support pattern 500 may also have a rounding or rounded form. As such, the term "hexagonal shape" as described herein may include substantially hexagonal shapes, including asymmetries which may result for example from deviations or tolerances in manufacturing. The honey-comb structure includes an arrangement of hexagonal shapes defined by the respective support patterns 500.

Each of the support patterns 500 and the dummy support pattern 500D may include, for example, at least one of silicon nitride (SiN), silicon carbonitride (SiCN), silicon boronitride (SiBN), silicon oxycarbide (SiOC), silicon oxynitride (SiON), silicon oxycarbonitride (SiOCN), or combinations thereof. However, the technical ideas of the present disclosure are not limited thereto.

Although not shown, a peripheral circuit region or a core region may be located outside the cell region. The first region I of the cell region may be a region in which operable or functional memory cells are arranged. The second region II of the cell region may be a region which has a structure identical or similar to the first region I of the cell region, but in which dummy memory cells (which are non-functional or not actually operable to store data) are arranged.

The dummy memory cells placed in the second region II of the cell region may be formed for the purpose of preventing a problem that the shape of the patterns is not formed into a desired shape on the outer periphery of the cell memory region in the photolithography process, and/or that the shape is distorted due to interference, diffraction, etc., of light. Also, because the etching conditions at the outer periphery of the cell region in the etching process become different from those of the central portion, a bridge between the patterns may occur. Therefore, dummy memory cells may be formed so that the etching conditions at the outer peripheral region of the cell region are the same as or more similar to those of the central portion.

The substrate 100 may be bulk silicon or an SOI (silicon-on-insulator). Alternatively, the substrate 100 may be a silicon substrate, or may include other materials, such as but not limited to, for example, silicon germanium, SGOI (silicon germanium on insulator), indium antimonide, lead tellurium compounds, indium arsenic, indium phosphide, gallium arsenide or gallium antimonide. In the following description, the substrate 100 will be explained as a silicon substrate by way of example.

Although not shown, the substrate 100 of the cell region may include an active region. An element isolation or separation film (for example, 110 of FIG. 8) may be placed in the substrate 100 to define an active region. As the design rules of the semiconductor memory devices decrease, the active region may be formed in the form of diagonally extending bars.

A lower electrode BE and a dummy lower electrode DBE may be arranged on the cell region of the substrate 100 in a zigzag pattern in plan view. The lower electrode BE may be placed on a first region I of the cell region. The dummy lower electrode DBE may be placed on a second region II of the cell region. The dummy lower electrode DBE may be placed over the first region I and the second region II of the cell region. That is, at least a part of the dummy lower electrode DBE may be placed on the second region II of the cell region.

The support pattern 500 may be placed on and may extend along the side walls of the lower electrode BE. The support pattern 500 may connect each lower electrode BE or groups/subsets of the lower electrodes BE to provide structural support for the lower electrodes BE. The dummy support pattern 500D may be placed on and may extend along the side walls of the dummy lower electrode DBE. The dummy support pattern 500D may connect each dummy lower electrode DBE or groups/subsets of the dummy lower electrodes DBE to provide structural support for the dummy lower electrodes DBE. As used in describing support patterns herein, the term "connect" may refer to a physical or structural connection provided by the support pattern.

The lower electrode BE and the dummy lower electrode DBE may include, but are not limited to, for example, a doped semiconductor material, a conductive metal nitride (e.g., titanium nitride, tantalum nitride, or tungsten nitride, etc.), a metal (e.g., ruthenium, iridium, titanium or tantalum, etc.), or a conductive metal oxide (e.g., iridium oxide, etc.).

Referring to FIG. 2, the semiconductor memory device according to some embodiments may include first and second lower electrode groups BEG_1 and BEG_2 placed on the substrate 100.

The first lower electrode group BEG_1 may include a plurality of first lower electrodes BE1. The second lower electrode group BEG_2 may include a plurality of second lower electrodes BE2. The first and second lower electrode groups BEG_1 and BEG_2 may be spaced apart from each other.

The support pattern 500 may include a first support pattern 510 which connects the first lower electrode BE1, and a second support pattern 520 which connects the second lower electrode BE2. The first and second support patterns 510 and 520 may be arranged in a honey-comb structure. That is, the first and second support patterns 510 and 520 may have a hexagonal shape from a planar viewpoint, i.e., in plan view. The first support pattern and the second support patterns 510 and 520 may be a pair of the support patterns 500 that are closest to each other.

The expression "closest to" each other may mean that both the first support pattern 510 and the second support pattern 520 are immediately adjacent to each other, without intervening support patterns 500 therebetween. That is, when the first support pattern 510 and the second support pattern 520 are referred to as closest to each other, another support pattern 500 is not placed or arranged between the first support pattern 510 and the second support pattern 520.

The first lower electrode BE1 may include a first center lower electrode CBE_1 that is centrally positioned or placed within a hexagon or hexagonal shape that is defined by a plurality of first edge lower electrodes EBE_1 placed at vertices of the hexagon. The first center lower electrode CBE_1 may be spaced apart from each of the first edge lower electrodes EBE_1. Distances between the first center lower electrode CBE_1 and each first edge lower electrode EBE_1 may be the same.

Similarly, the second lower electrode BE2 may include a second center lower electrode CBE_2 that is centrally positioned or placed within a hexagon or hexagonal shape that is defined by a plurality of second edge lower electrodes EBE_2 placed at the vertices of the hexagon. The second center lower electrode CBE_2 may be spaced apart from each of the second edge lower electrodes EBE_2. Distances between the second center lower electrode CBE_2 and each second edge lower electrode EBE_2 may be the same.

Six first edge lower electrodes EBE_1 and six second edge lower electrodes EBE_2 may be provided around the first center lower electrode CBE_1 and the second center lower electrode CBE_2, respectively. However, the technical ideas of the present disclosure are not limited thereto.

The first edge lower electrode EBE_1 may be spaced apart from the first center lower electrode CBE_1 in a first direction D1, a third direction D3 and a fourth direction D4. Specifically, two first edge lower electrodes EBE_1 among the six first edge lower electrodes EBE_1 may be spaced apart from the first center lower electrode CBE_1 in the first direction D1. Two other first edge lower electrodes EBE_1 may be spaced apart from the first center lower electrode CBE_1 in the third direction D3. The remaining two first edge lower electrodes EBE_1 may be spaced apart from the first center lower electrode CBE_1 in the fourth direction D4.

The second edge lower electrode EBE_2 may be spaced apart from the second center lower electrode CBE_2 in the first direction D1, the third direction D3 and the fourth direction D4. Two second edge lower electrodes EBE_2 among the six second edge lower electrodes EBE_2 may be spaced apart from the second center lower electrode CBE_2 in the first direction D1. Two other second edge lower electrodes EBE_2 may be spaced apart from the second center lower electrode CBE_2 in the third direction D3. The remaining two second edge lower electrodes EBE_2 may be spaced apart from the second center lower electrode CBE_2 in the fourth direction D4.

The first center lower electrode CBE_1 may be spaced apart from the second center lower electrode CBE_2 in a fifth direction D5. The fifth direction D5 is different from the first direction D1, the third direction D3, and the fourth direction D4. The fifth direction D5 may be an arbitrary direction between the first direction D1 and the third direction D3. That is, a direction D1, D3, D4 in which the first center lower electrode CBE_1 and the first edge lower electrode EBE_1 are spaced apart from each other is different from a direction D5 in which the first center lower electrode CBE_1 and the second center lower electrode CBE_2 are spaced apart from each other.

In some embodiments, the semiconductor memory device of the present disclosure may further include a third lower electrode group BEG_3 placed on the substrate 100. The third lower electrode group BEG_3 may be closest to both the first and second lower electrode groups BEG_1 and BEG_2. That is, each of the first to third lower electrode groups BEG_1, BEG_2, and BEG_3 may be closest to each other.

The third lower electrode group BEG_3 may include a plurality of third lower electrodes BE3. The plurality of third lower electrodes BE3 may include a third center lower electrode CBE_3, and a third edge lower electrode EBE_3 spaced apart from the third center lower electrode CBE_3.

The support patterns 500 may include a third support pattern 530 that connects the respective third lower electrodes BE3. The third support pattern 530 may be arranged in a honey-comb structure. That is, the third support pattern 530 may have a hexagonal shape from a planar viewpoint, i.e., in plan view.

The third edge lower electrodes EBE_3 may be arranged to define a hexagon or hexagonal shape, e.g., placed at respective vertices of the hexagon. The third center lower electrode CBE_3 may be centrally positioned or placed within the hexagon defined by the third edge lower electrodes EBE_3. Six third edge lower electrodes EBE_3 may be provided. However, the technical ideas of the present disclosure are not limited thereto.

The third edge lower electrode EBE_3 may be spaced apart from the third center lower electrode CBE_3 in the first direction D1, the third direction D3 and the fourth direction D4. Two third edge lower electrodes EBE_3 among the six third edge lower electrodes EBE_3 may be spaced apart from the third center lower electrode CBE_3 in the first direction D1. Two other third edge lower electrodes EBE_3 may be spaced apart from the third center lower electrode CBE_3 in the third direction D3. The remaining two third edge lower electrodes EBE_3 may be spaced apart from the third center lower electrode CBE_3 in the fourth direction D4.

The third center lower electrode CBE_3 may be spaced apart from the first and second center lower electrodes CBE_1 and CBE_2. Each of the distances between the first to third center lower electrodes CBE_1, CBE_2, and CBE_3 may be substantially the same. Each of a distance L1 between the first center lower electrode CBE_1 and the second center lower electrode CBE_2, a distance L2 between the second center lower electrode CBE_2 and the third center lower electrode CBE_3, and a distance L3 between the third center lower electrode CBE_3 and the first center lower electrode CBE_1 may be the same.

The first center lower electrode CBE_1 may be spaced apart from the third center lower electrode CBE_3 in a sixth direction D6. The sixth direction D6 is different from the first direction D1, the third direction D3, the fourth direction D4, and the fifth direction D5. For example, the sixth direction D6 may be an arbitrary direction between the third direction D3 and the fourth direction D4.

The second center lower electrode CBE_2 may be spaced apart from the third center lower electrode CBE_3 in a seventh direction D7. The seventh direction D7 is different from the first direction D1, the third direction D3, the fourth direction D4, the fifth direction D5, and the sixth direction D6. For example, the seventh direction D7 may be an arbitrary direction different from and/or between the second direction D2 and the fourth direction D4.

A direction D6 in which the third center lower electrode CBE_3 and the first center lower electrode CBE_1 are spaced apart from each other is different from a direction D1, D3, D4 in which the third center lower electrode CBE_3 and the third edge lower electrode EBE_3 are spaced apart from each other. A direction D7 in which the third center lower electrode CBE_3 and the second center lower electrode CBE_2 are spaced apart from each other is different from a direction D1, D3, D4 in which the third center lower electrode CEB_3 and the third edge lower electrode EBE_3 are spaced apart from each other. The directions in which the first to third center lower electrodes CBE_1, CBE_2, and CBE_3 are spaced apart from each other may all be different.

In some embodiments, the first to third center lower electrodes CBE_1, CBE_2, and CBE_3 may each correspond to the vertices of an equilateral triangle. Therefore, an angle between the fifth direction D5 and the sixth direction D6 may be 60°. Similarly, an angle between the sixth direction D6 and the seventh direction D7 may be 60°. However, the technical ideas of the present disclosure are not limited thereto.

Referring to FIGS. 3A to 4B, landing pads 200 connected to the active regions may be placed on the substrate 100. An interlayer insulating film 105 that electrically separates the landing pads 200 may be placed on the substrate 100.

The landing pads 200 may include a conductive material. For example, although the landing pads 200 may include tungsten (W), the technical ideas of the present disclosure are not limited thereto.

The interlayer insulating film 105 includes an insulating material, and may electrically separate a plurality of landing pads 200 from each other. For example, although the interlayer insulating film 105 may include a silicon oxide, the technical ideas of the present disclosure are not limited thereto.

An etching stopping film 300 may be placed on the interlayer insulating film 105. The etching stopping film 300 may be, for example, a silicon nitride film. The lower electrodes BE may penetrate the etching stopping film 300 and be connected to the landing pads 200.

The first lower electrode BE1 may include a first center lower electrode CBE_1, and two first edge lower electrodes EBE_1 spaced apart from the first center lower electrode CBE_1 in the first direction D1.

The first support pattern 510 may be placed on side walls BE1_ss of the first lower electrode BE1. The first support pattern 510 may structurally or mechanically support the first center lower electrode CBE_1 and the first edge lower electrode EBE_1.

The first support pattern 510 may include a first upper support pattern 511 spaced apart from the substrate 100 in an eighth direction D8, and a first lower support pattern 513 placed between the first upper support pattern 511 and the substrate 100. The eighth direction D8 may be, for example, a thickness direction of the substrate 100. However, the technical ideas of the present disclosure are not limited thereto. For example, the first support pattern 510 may be a single pattern, or the first support pattern 510 may also be formed by a plurality of patterns of three or more.

The second lower electrode BE2 may include a plurality of second edge lower electrodes EBE_2 that are spaced apart from each other in the first direction D1. The second lower electrode BE2 may include a plurality of second edge lower electrodes EBE_2 that are spaced apart from each other in the fourth direction D4.

The second support pattern 520 may be placed on side walls BE2_ss of the second lower electrode BE2. The second support pattern 520 may structurally or mechanically support the second edge lower electrodes EBE_2.

The second support pattern 520 may include a second upper support pattern 521 spaced apart from the substrate 100 in the eighth direction D8, and a second lower support pattern 523 placed between the second upper support pattern 521 and the substrate 100. However, the technical ideas of the present disclosure are not limited thereto. For example, the second support pattern 520 may be a single pattern, or the second support pattern 520 may also be formed by a plurality of patterns of three or more.

The third lower electrode BE3 may include a third center lower electrode CBE_3, and two third edge lower electrodes EBE_3 spaced apart from the third center lower electrode CBE_3 in the fourth direction D4.

The third support pattern 530 may be placed on the side walls BE3_ss of the third lower electrode BE3. The third support pattern 530 may include a third upper support pattern 531 spaced apart from the substrate 100 in the eighth direction D8, and a third lower support pattern 533 placed between the third upper support pattern 531 and the substrate 100. However, the technical ideas of the present disclosure are not limited thereto. For example, the third support pattern 530 may be a single pattern, or the third support pattern 530 may also be formed by a plurality of patterns of three or more.

Upper surfaces 511_us, 521_us, and 531_us of the first to third upper support patterns 511, 521, and 531 may be substantially coplanar with or placed on the same plane as upper surfaces BE1_us, BE2_us, and BE3_us of the first to third lower electrodes BE1, BE2, and BE3, respectively. However, the technical ideas of the present disclosure are not limited thereto.

A capacitive dielectric film 400 may be placed on the first to third lower electrodes BE1, BE2, and BE3. The capacitive dielectric film 400 may be placed on the first to third support patterns 510, 520, and 530.

The capacitive dielectric film 400 may be formed along the side walls BE1_ss of the first lower electrode BE1, the upper surface of the etching stopping film 300, and the lower surface of the first lower support pattern 513. The capacitive dielectric film 400 may be formed along the side walls BE1_ss of the first lower electrode BE1, the upper surface of the first lower support pattern 513, and the lower surface of the first upper support pattern 511.

The capacitive dielectric film 400 may be formed along the side walls BE2_ss of the second lower electrode BE2, the upper surface of the etching stopping film 300, and the lower surface of the second lower support pattern 523. The capacitive dielectric film 400 may be formed along the side walls BE2_ss of the second lower electrode BE2, the upper surface of the second lower support pattern 523, and the lower surface of the second upper support pattern 521.

The capacitive dielectric film 400 may be formed along the side walls BE3_ss of the third lower electrode BE3, the upper surface of the etching stopping film 300, and the lower surface of the third lower support pattern 533. The capacitive dielectric film 400 may be formed along the side walls BE3_ss of the third lower electrode BE3, the upper surface of the third lower support pattern 533, and the lower surface of the third upper support pattern 531.

An upper electrode 600 may be placed on the capacitive dielectric film 400, such that the upper electrode 600, the lower electrodes BE, and the capacitive dielectric film 400 therebetween define capacitors for the memory device.

The capacitive dielectric film 400 may include, but is not limited to, for example, at least one of silicon oxide, silicon nitride, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or combinations thereof.

The upper electrode 600 may include, but is not limited to, for example, at least one of a doped semiconductor material, a metal, a conductive metal nitride, or a metal silicide.

The first to third lower electrodes BE1, BE2, and BE3 may have a cylinder shape, as shown in FIGS. 3A and 4A. Also, the first to third lower electrodes BE1, BE2, and BE3 may have a pillar shape as shown in FIGS. 3B and 4B.

Figure 5:
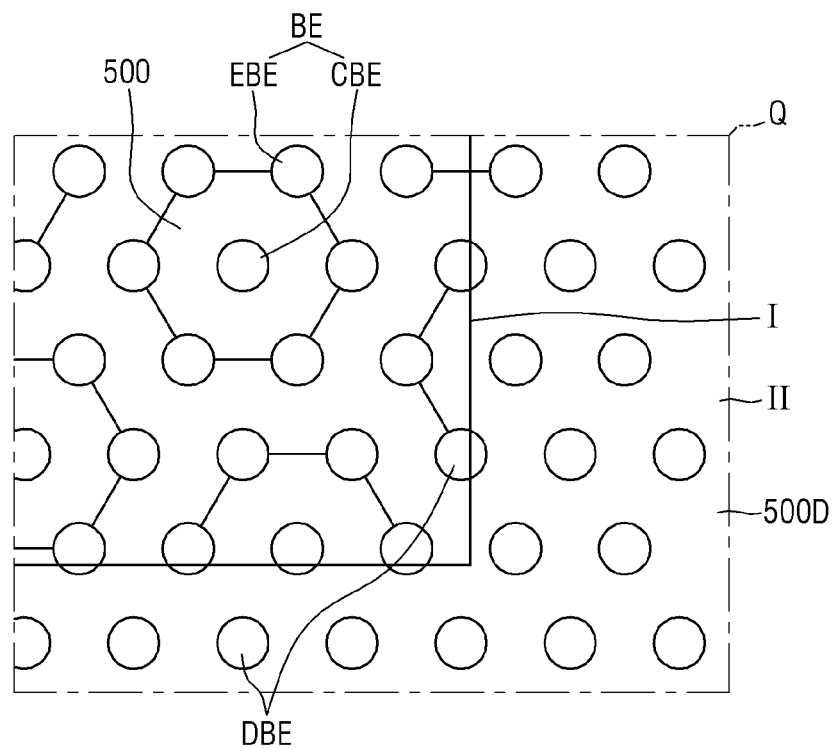
FIG. 5 is an enlarged view of a region Q of FIG. 1.
Figure 6A:
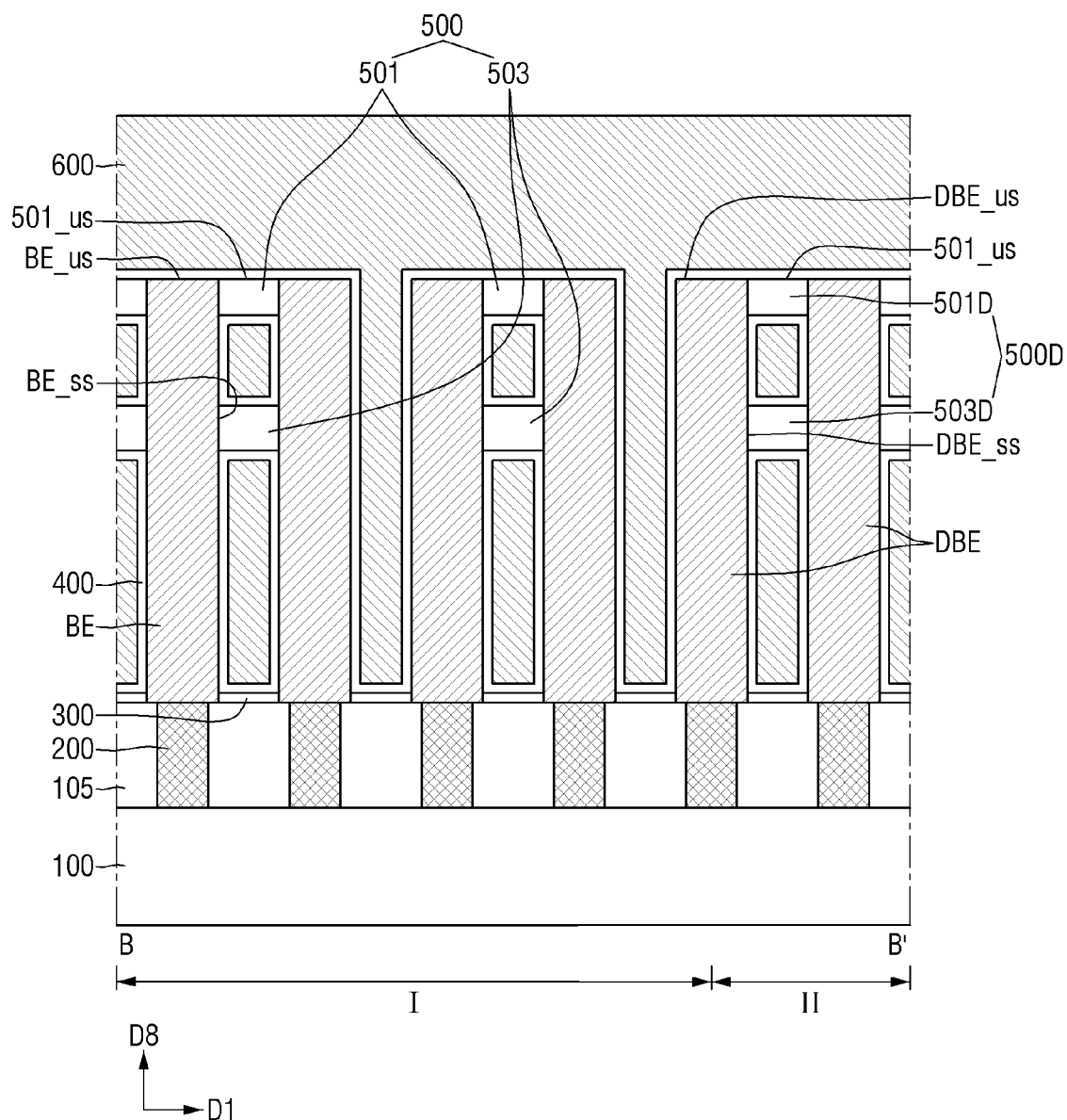
FIGS. 6A and 6B are cross-sectional views taken along B-B' of FIG. 1.
Figure 6B:
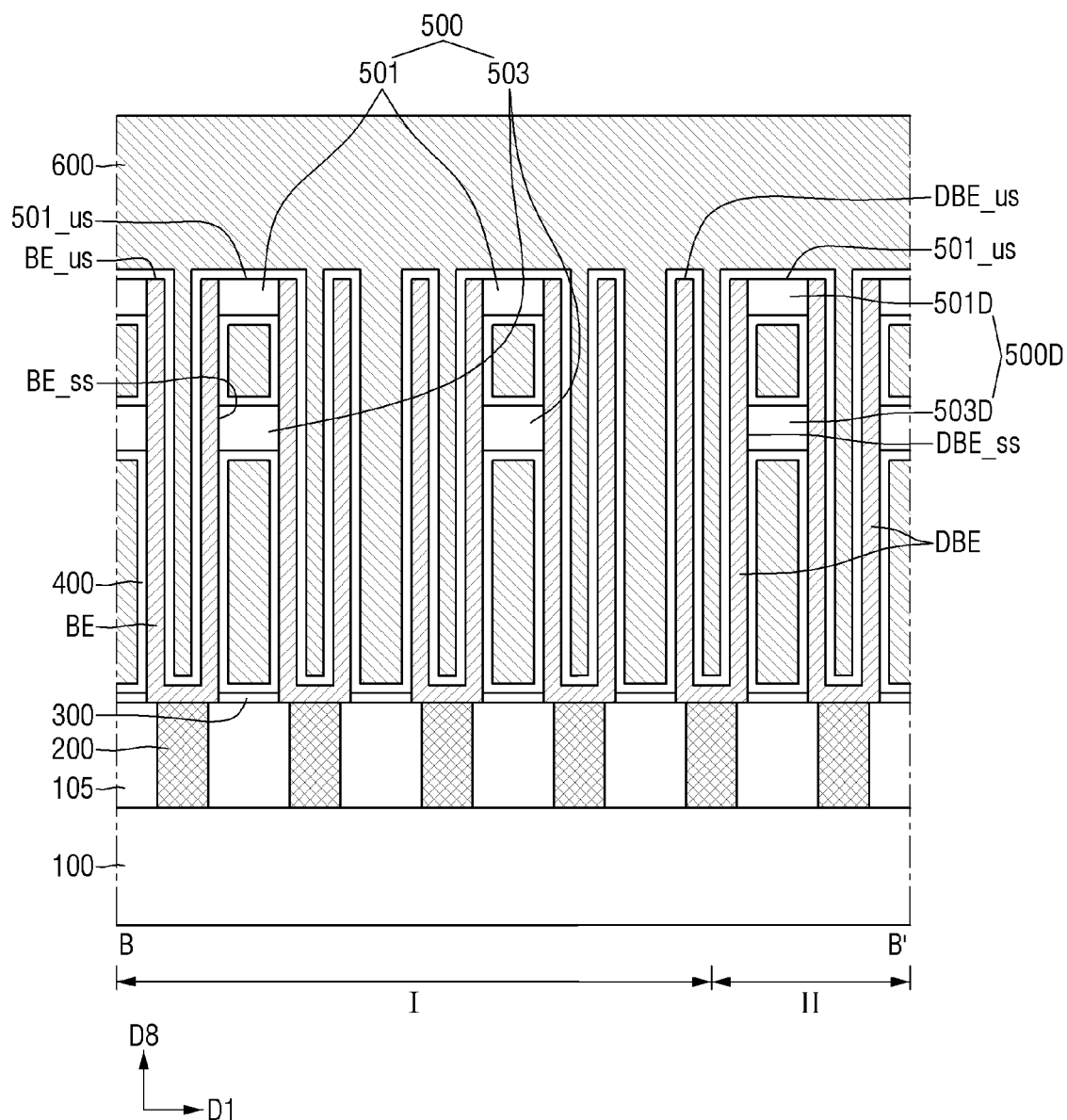

FIG. 5 is an enlarged view of a region Q of FIG. 1. FIGS. 6A and 6B are cross-sectional views taken along B-B' of FIG. 1. For convenience of explanation, different points or features from those described in FIGS. 1 to 4B will be mainly described.

Referring to FIGS. 5 to 6B, the cell region of the semiconductor memory device according to some embodiments may include a first region I and a second region II.

The first region I of the cell region may be a region in which the functional memory cells are placed and operated. The second region II of the cell region may be a region which has a structure identical or similar to the first region I of the cell region, but in which dummy memory cells that are non-functional or not actually operated are placed.

A lower electrode BE may be placed on the first region I of the cell region. A support pattern 500 may be placed on the substrate 100. The support pattern 500 is placed on side walls BE_ss of the lower electrode BE, and may connect each lower electrode BE.

The support pattern 500 may include an upper support pattern 501 spaced apart from the substrate 100 in the eighth direction D8, and a lower support pattern 503 placed between the upper support pattern 501 and the substrate 100. However, the technical ideas of the present disclosure are not limited thereto. For example, the support pattern 500 may be a single pattern, or the support pattern 500 may also be formed by a plurality of patterns of three or more.

The support pattern 500 may be arranged in a honeycomb structure. The support pattern 500 may have a hexagonal shape from a planar viewpoint, i.e., in plan view. The lower electrode BE may include a center lower electrode CBE placed or centrally positioned within the hexagon. The lower electrode BE may include edge lower electrodes EBE that are placed or peripherally arranged at vertices of the hexagon and are spaced apart from the center lower electrode CBE.

A plurality of dummy lower electrodes DBE may be placed on the second region II of the cell region. A dummy support pattern 500D which is placed on the side walls DBE_ss of the dummy lower electrode DBE and connects the respective dummy lower electrodes DBE may be placed on the substrate 100. The dummy support pattern 500D may extend along the second region II of the cell region.

The dummy support pattern 500D may include an upper dummy support pattern 501D spaced apart from the substrate 100 in the eighth direction D8, and a lower dummy support pattern 503D placed between the upper dummy support pattern 501D and the substrate 100. However, the technical ideas of the present disclosure are not limited thereto. For example, the dummy support pattern 500D may be a single pattern, or the dummy support patterns 500D may also be formed by a plurality of patterns of three or more.

The dummy lower electrodes DBE may be placed at a boundary between the first region I and the second region II of the cell region. That is, at least a part of the dummy lower electrodes DBE may overlap the second region II of the cell region in the eighth direction D8.

The lower electrodes BE may overlap the first region I of the cell region in the eighth direction D8. The lower electrodes BE may not overlap the second region II of the cell region in the eight direction D8.

The lower electrodes BE and the dummy lower electrodes DBE may have cylindrical shapes or pillar shapes. However, the technical ideas of the present disclosure are not limited thereto.

An upper surface BE_us of the lower electrode BE, an upper surface 501_us of the upper support pattern 501, an upper surface DBE_us of the dummy lower electrode DBE, and an upper surface of the upper dummy support pattern 501D_us may be substantially coplanar or placed on the same plane. However, the technical ideas of the present disclosure are not limited thereto.

Figure 7:
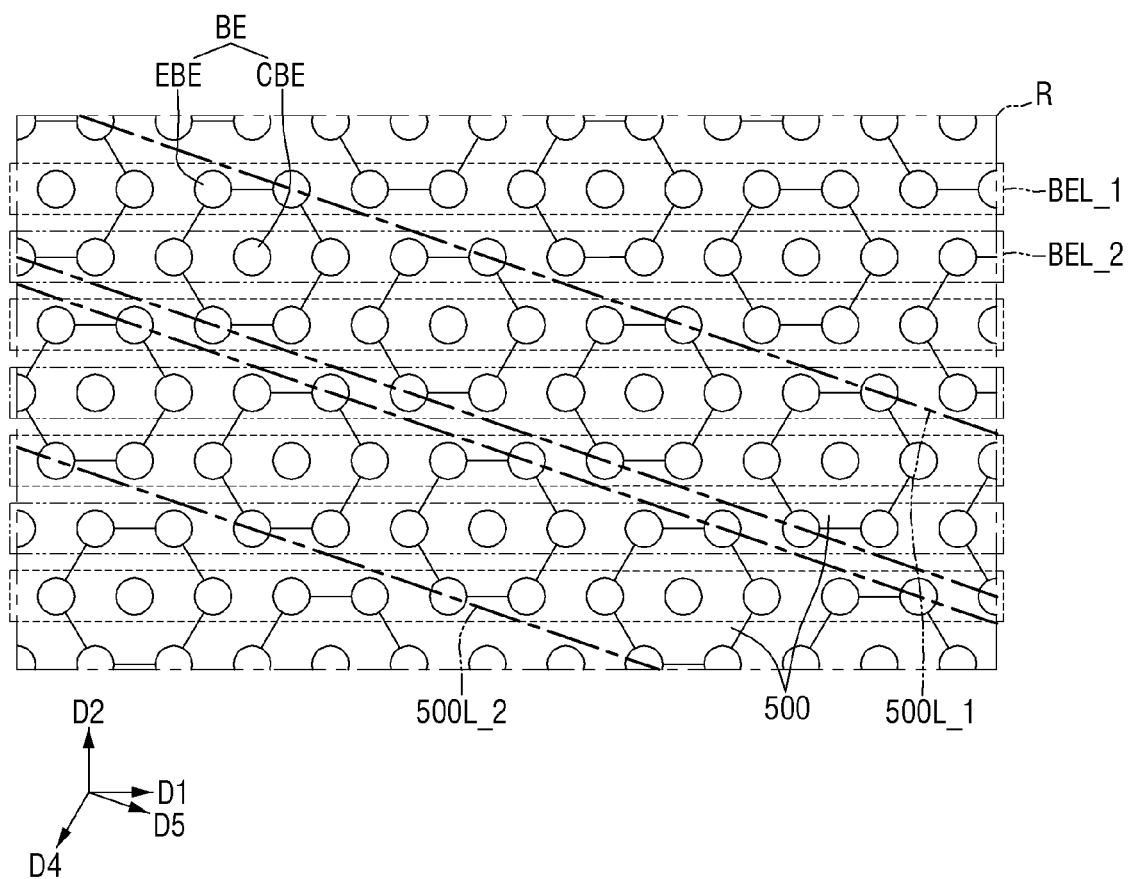
FIG. 7 is an enlarged view of a region R of FIG. 1.

FIG. 7 is an enlarged view of the region R of FIG. 1.

Referring to FIG. 7, a plurality of lower electrodes BE and a plurality of support patterns 500 may be placed on the substrate 100. The support pattern 500 may connect each of a group of lower electrodes BE.

In some embodiments, the lower electrodes BE may include first and second lower electrode lines BEL_1 and BEL_2 that extend in the first direction D1. That is, subsets of the lower electrodes BE may be aligned along the direction D1 to define the lower electrode lines BEL_1, BEL_2. The first lower electrode line BEL_1 and the second lower electrode line BEL_2 may not intersect each other. The first lower electrode line BEL_1 and the second lower electrode line BEL_2 may extend to be parallel with each other.

The first lower electrode line BEL_1 and the second lower electrode line BEL_2 may be adjacent to each other in the second direction D2. The first lower electrode line BEL_1 and the second lower electrode line BEL_2 may be spaced apart from each other in the second direction D2.

The lower electrodes BE included in the first lower electrode line BEL_1 may be offset in the second direction D2 with respect to the lower electrodes BE included in the second lower electrode line BEL_2. Respective centers of the lower electrodes included in the first lower electrode line BEL_1 and respective centers of the lower electrodes included in the second lower electrode line BEL_2 may not overlap in the second direction D2. That is, the plurality of lower electrodes BE may be arranged in a zigzag pattern.

The support pattern 500 may have a hexagonal shape. The lower electrodes BE may include an edge lower electrode EBE placed at the vertex of the hexagon, and a center lower electrode CBE centrally positioned within (e.g., placed at the center of) the hexagon. That is, the six edge lower electrodes EBE may be provided around the center lower electrode CBE. However, the technical ideas of the present disclosure are not limited thereto.

The support pattern 500 may include a first support pattern line 500L_1 and a second support pattern line 500L_2 extending in the fifth direction D5. The fifth direction D5 may be one of the directions in which the plurality of center lower electrodes CBE are spaced apart from each other.

The first support pattern line 500L_1 and the second support pattern line 500L_2 may be spaced apart from each other in the fourth direction D4. The fourth direction D4 may be one of the directions in which the center lower electrode CBE and the edge lower electrode EBE are spaced apart from each other.

The fourth direction D4 and the fifth direction D5 may intersect each other. Therefore, the first support pattern line 500L_1 and the second support pattern line 500L_2 may not intersect each other. The first support pattern line 500L_1 and the second support pattern line 500L_2 may be parallel to each other.

Respective centers of the support pattern 500 included in the first support pattern line 500L_1 and respective centers of the support pattern 500 included in the second support pattern line 500L_2 may be offset from each other in the fourth direction D4. The respective centers of the support patterns 500 included in the first support pattern line 500L_1 and the respective centers of the support patterns 500 included in the second support pattern line 500L_2 may not overlap in the fourth direction D4. That is, the support patterns 500 may be arranged in a zigzag pattern.

Figure 8:
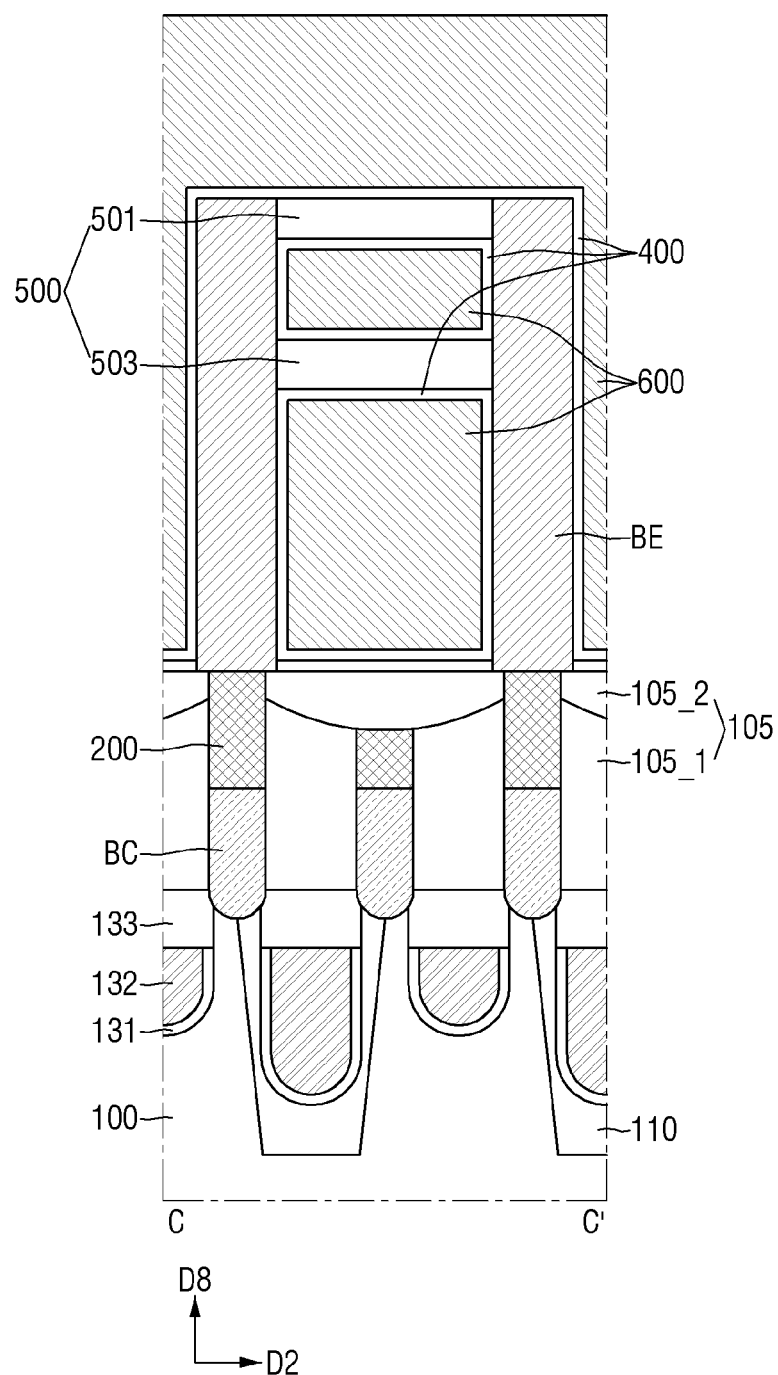
FIG. 8 is a cross-sectional view taken along C-C' of FIG. 1.

FIG. 8 is a cross-sectional view taken along C-C' of FIG. 1. For convenience of explanation, points or features that are different from those described in FIGS. 1 to 7 will be mainly described.

Referring to FIGS. 1 and 8, a semiconductor memory device of the present disclosure may include an element isolation or separation film 110, a gate structure 130, a buried contact (BC), an interlayer insulating film 105, and a landing pad 200.

The element separation film 110 may be formed in the substrate 100. The element separation film 110 may have an STI (shallow trench isolation) structure having excellent element separation characteristics.

In some embodiments, the gate structures 130 may be buried in the substrate 100. The gate structure 130 may include a gate insulating film 131, a gate electrode 132, and a gate capping pattern 133. The gate electrode 132 may be a word line. Although not shown, the word line may be buried in the substrate 100 and extend in the first direction D1. The word lines may be spaced apart from each other in the second direction D2.

The gate structures 130 may be insulated from the substrate 100 due to the gate insulating film 131 and the capping pattern 133. Impurity injection regions may be formed in or placed on the substrate 100 on opposite sides of the word line to form source/drain regions. Each bit line may be electrically connected to a respective impurity injection region on one side of the word lines.

The gate insulating film 131 may include silicon oxide, silicon nitride, silicon oxynitride, or a high dielectric constant material having a higher dielectric constant than silicon oxide. The high dielectric constant material may include, for example, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or combinations thereof.

The gate electrode 132 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or combinations thereof.

The gate capping pattern 133 may include, for example, at least one of polysilicon, silicon nitride (SiN), silicon oxynitride (SiON), silicon oxide (SiO$_2$), silicon carbonitride (SiCN), silicon oxycarbonitride (SiOCN) and combinations thereof.

A buried contact BC connected to the active region may be formed on the substrate 100. The landing pad 200 may be connected to the buried contact BC. The buried contact BC may include a conductive material. This allows the buried contact BC to be electrically connected to the active region. Although the buried contact BC may include, for example, polysilicon, the technical idea of the disclosure is not limited thereto.

The landing pad 200 may be placed on the upper surface of the buried contact BC. The landing pad 200 may be in contact with the buried contact BC. Similarly to the buried contact BC, the landing pad 200 may form a plurality of electrically isolated regions that are spaced apart from each other.

The interlayer insulating film 105 may include a first interlayer insulating film 105_1 and a second interlayer insulating film 105_2.

The first interlayer insulating film 105_1 may be formed on the substrate 100 and the element separation film 110. The first interlayer insulating film 105_1 may be formed to overlap the gate structure 130 formed in the substrate 100 and the element separation film 110.

Although the first interlayer insulating film 105_1 may include, for example, at least one of silicon oxide, silicon nitride, silicon oxynitride, or combinations thereof, the technical ideas of the present disclosure are not limited thereto. The first interlayer insulating film 105_1 may separate the buried contacts BC.

The second interlayer insulating film 105_2 may define a region of the landing pad 200 that forms a plurality of isolated regions. That is, the second interlayer insulating film 105_2 may separate a plurality of landing pads 200 from each other.

The second interlayer insulating film 105_2 includes an insulating material and may electrically separate the plurality of landing pads 200 from each other. For example, although the second interlayer insulating film 105_2 may include silicon oxide, the technical ideas of the present disclosure are not limited thereto.

A lower electrode BE connected to the landing pad 200 may be placed on the landing pad 200 and the interlayer insulating film 105. The support pattern 500 may be placed on the side walls of each lower electrode BE. The support pattern 500 may mechanically or structurally support each of (or groups of) the lower electrodes BE.

The support pattern 500 may include an upper support pattern 501 spaced apart from the substrate 100 in the eighth direction D8, and a lower support pattern 503 between the upper support pattern 501 and the substrate 100.

A capacitive dielectric film 400 may be conformally formed along the profiles of the lower electrode BE and the upper support pattern 501. An upper electrode 600 may be formed on the capacitive dielectric film 400 to form one or more capacitor structures.

FIGS. 9 to 17 are intermediate stage diagrams for explaining a method for fabricating the semiconductor memory device according to some embodiments. The method for fabricating the semiconductor memory device according to some embodiments will be described referring to some of the embodiments shown in FIGS. 1 to 8.

Figure 9:
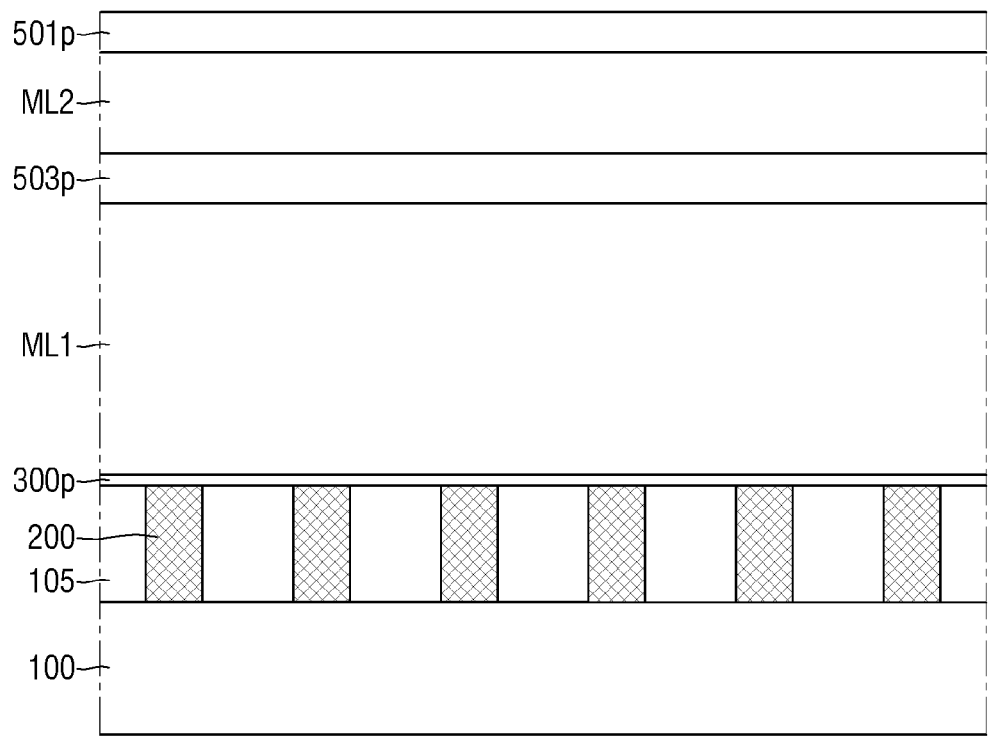
FIGS. 9, 10, 11, 12, 13, 14, 15, 16, and 17 are intermediate stage diagrams illustrating methods for fabricating the semiconductor memory device according to some embodiments.

Referring to FIG. 9, the landing pad 200 and the interlayer insulating film 105 may be formed on the substrate 100. The interlayer insulating film 105 may electrically insulate the plurality of landing pads 200.

Although not shown, a plurality of word lines may be buried in the substrate 100. The element separation film (for example, 110 of FIG. 8) that defines a plurality of active regions may be formed in the substrate 100. The buried contact (e.g., BC of FIG. 8) that is connected to the active region may be formed on the substrate 100. The landing pad 200 may be connected to the buried contact.

A pre etching stopping film 300p may be formed on the landing pad 200 and the interlayer insulating film 105. Next, a first mold layer ML1, a pre lower support pattern 503p, a second mold layer ML2, and a pre upper support pattern 501p may be sequentially formed. The first mold layer ML1 and the second mold layer ML2 may be silicon oxide films.

The pre lower support pattern 503p and the pre upper support pattern 501p may include, for example, at least one of silicon nitride (SiN), silicon carbonitride (SiCN), silicon boronitride (SiBN), silicon oxycarbide (SiOC), silicon oxynitride (SiON), or silicon oxycarbonitride (SiOCN). However, the technical ideas of the present disclosure are not limited thereto.

Although the drawings show that two pre support patterns 501p and 503p are formed, the technical ideas of the present disclosure are not limited thereto, and only one pre support pattern may of course be formed. In this case, the support pattern (e.g., 500 of FIG. 6A) of the semiconductor memory device according to some embodiments may be a single pattern. Also, three or more pre support patterns may be formed. In this case, the support pattern of the semiconductor memory device according to some embodiments may include three or more support patterns.

Figure 10:
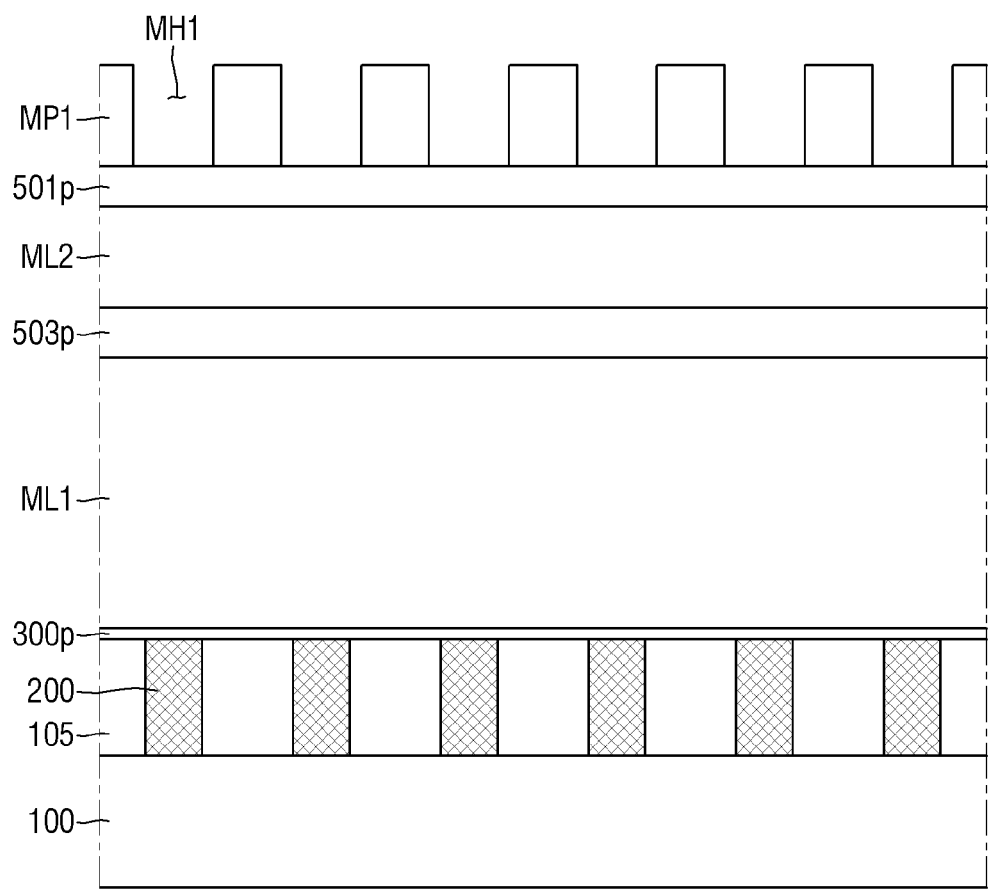

Referring to FIG. 10, a first mask pattern MP1 may be formed on the pre upper support pattern 501p. A first mask hole MH1 that exposes the pre upper support pattern 501p may be formed.

The first mask pattern MP1 may be, for example, a photoresist film. The first mask pattern MP1 may overlap the interlayer insulating film 105 in the vertical direction (e.g., D8).

Figure 11:
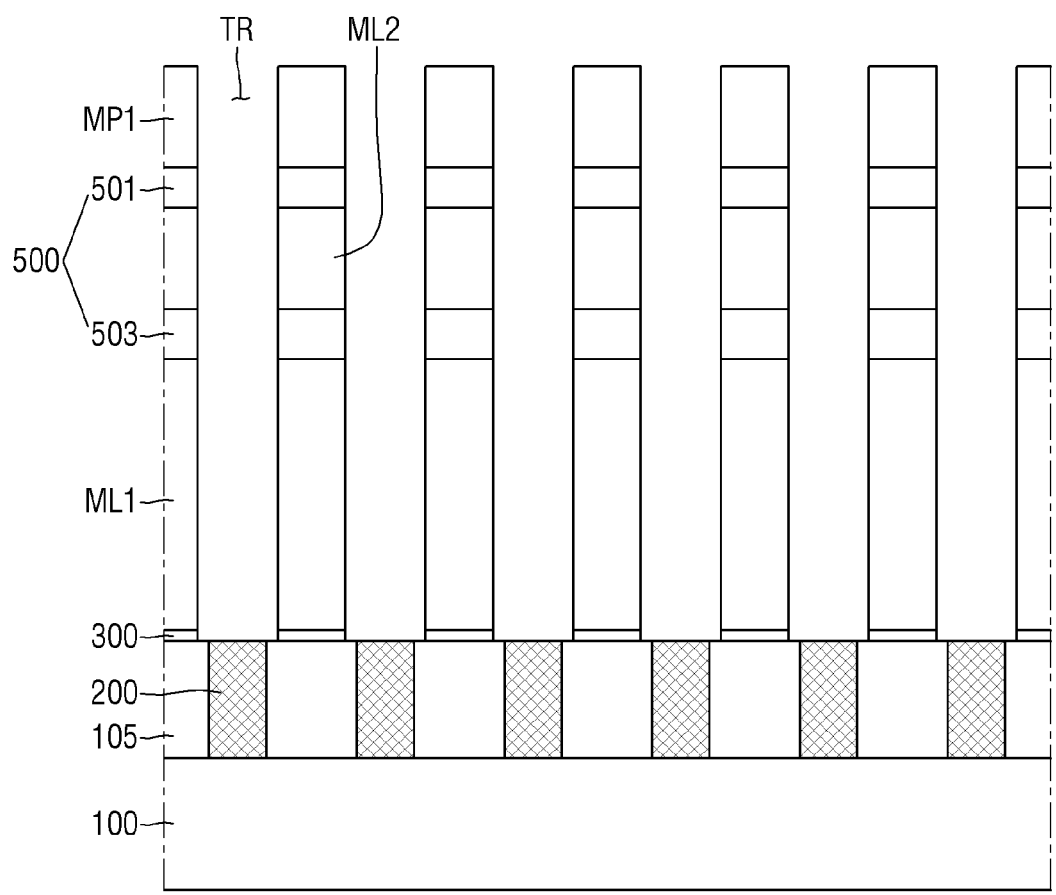

Referring to FIG. 11, the pre upper support pattern 501p, the second mold layer ML2, the pre lower support pattern 503p, the first mold layer ML1, and the pre etching stopping film 300p may be etched to form a plurality of trenches TR.

The trenches TR may be formed to be the same as the width of the first mask hole MH1. The trenches TR may expose the landing pad 200. An upper support pattern 501, a lower support pattern 503, and an etching stopping film 300 may be formed by the etching process.

Figure 12:
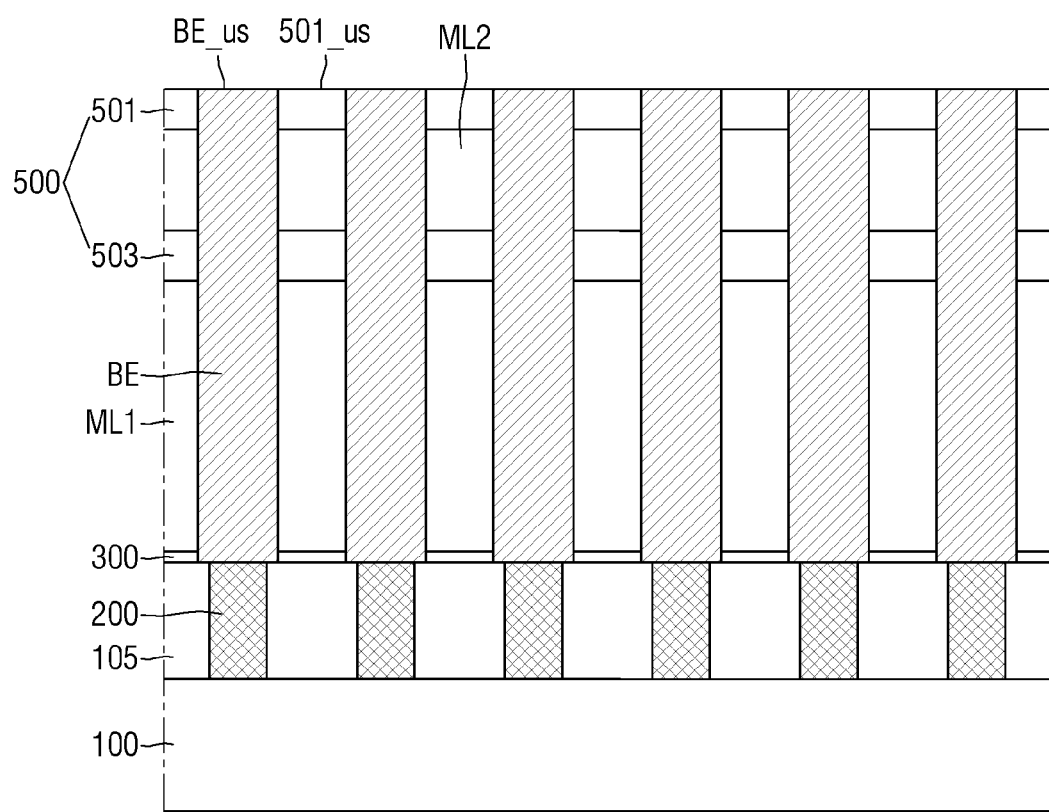

Referring to FIG. 12, a lower electrode BE that fills the trench TR may be formed. The first mask pattern MP1 may be removed.

The lower electrode BE may be connected to the landing pad 200. The upper surface BE_us of the lower electrode BE may be substantially coplanar with or placed on the same plane as the upper surface 501_us of the upper support pattern 501. Here, the term "same" does not mean that both are physically exactly the same, but may also include process margins.

Figure 13:
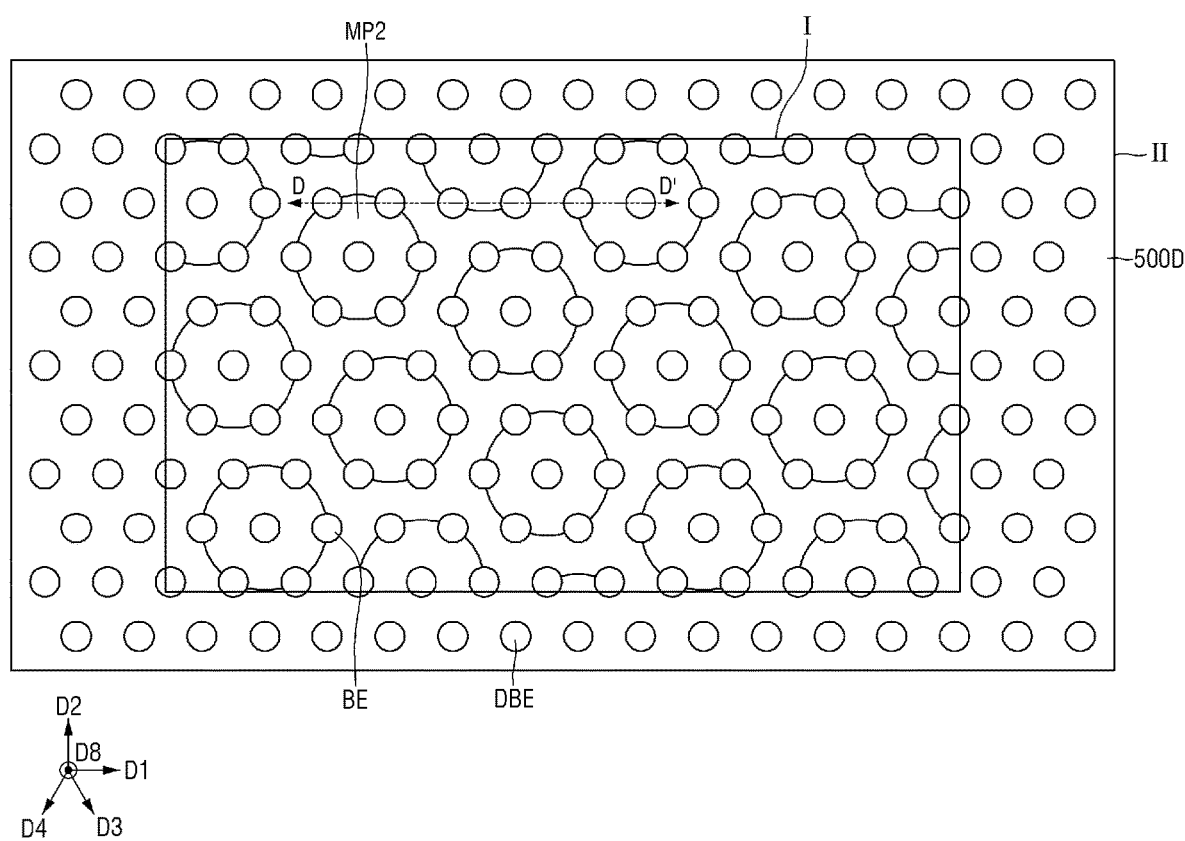

FIG. 13 is a plan view for explaining a second mask pattern MP2.

Referring to FIG. 13, the second mask pattern MP2 may have a round (e.g., circular) shape from a planar viewpoint (i.e., in plan view). However, the technical ideas of the present disclosure are not limited thereto, and the second mask pattern MP2 may have an elliptical shape or a hexagonal shape.

The second mask pattern MP2 may be a photoresist film. The second mask pattern MP2 may define the shapes of the support patterns 500 shown in FIGS. 1 to 7.

A lower electrode BE may be centrally positioned or placed at the center of a respective second mask pattern MP2. Further, lower electrodes BE may be peripherally positioned or placed along the outer circumference of the second mask pattern MP2. The lower electrode BE placed at the center of the second mask pattern MP2 may be a center lower electrode (e.g., CBE of FIG. 5). The lower electrodes BE placed on the outer circumference of the second mask pattern MP2 may be edge lower electrodes (for example, EBE of FIG. 5).

Although not shown, the second mask pattern MP2 may have a rectangular shape from a planar viewpoint. A mask layer may be formed on the upper support pattern 501 and the lower electrode BE. The second mask pattern MP2 may also be formed by etching the mask layer with two different lines. An intersection between the two different lines may be a second mask hole (e.g., MH2 of FIG. 14).

FIGS. 14 to 17 are cross-sectional views taken along D-D' of FIG. 13.

Figure 14:
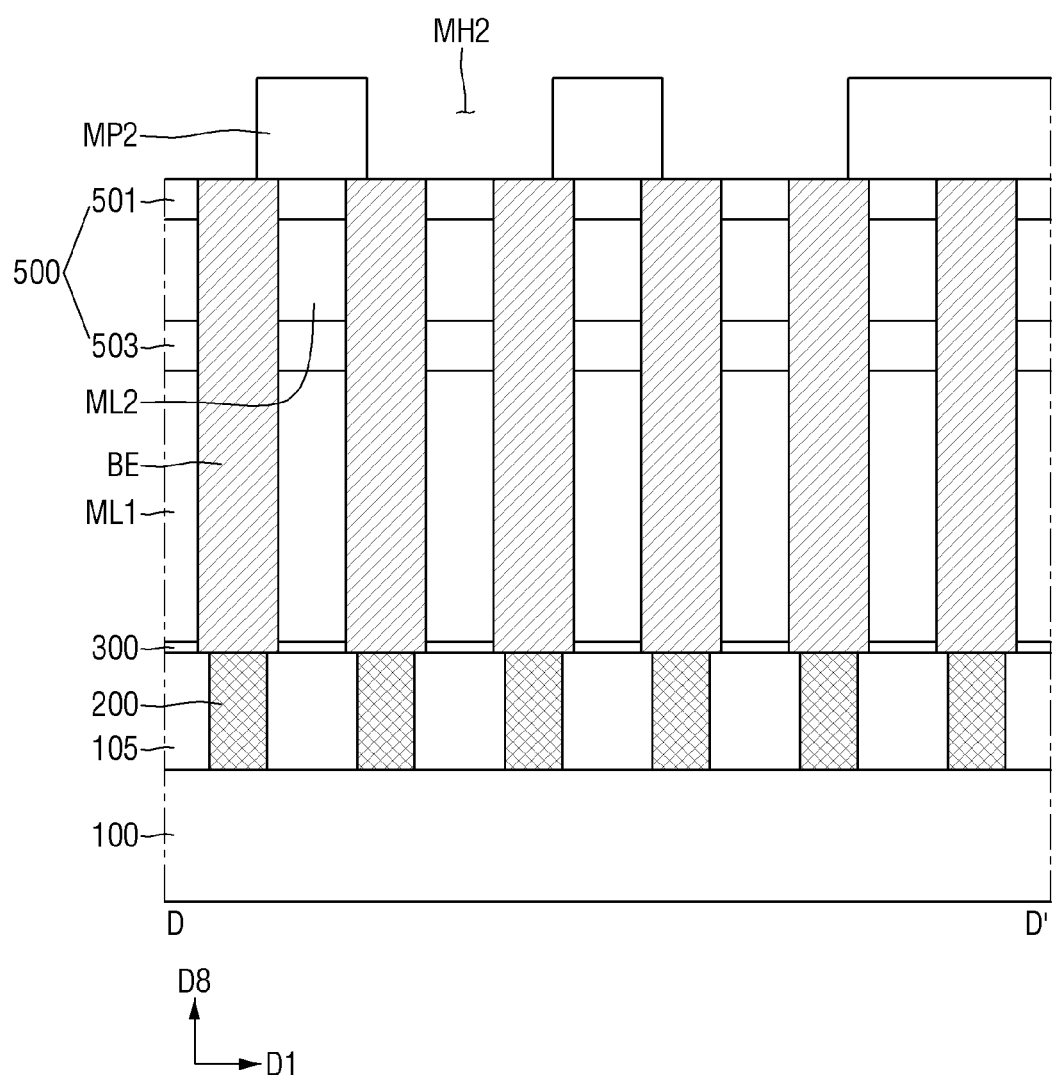

Referring to FIG. 14, a second mask pattern MP2 may be formed on the lower electrode BE and the upper support pattern 501.

A second mask hole MH2 that exposes some lower electrodes BE and some upper support patterns 501 may be formed. The second mask hole MH2 may be a hole between the second mask patterns MP2.

Figure 15:
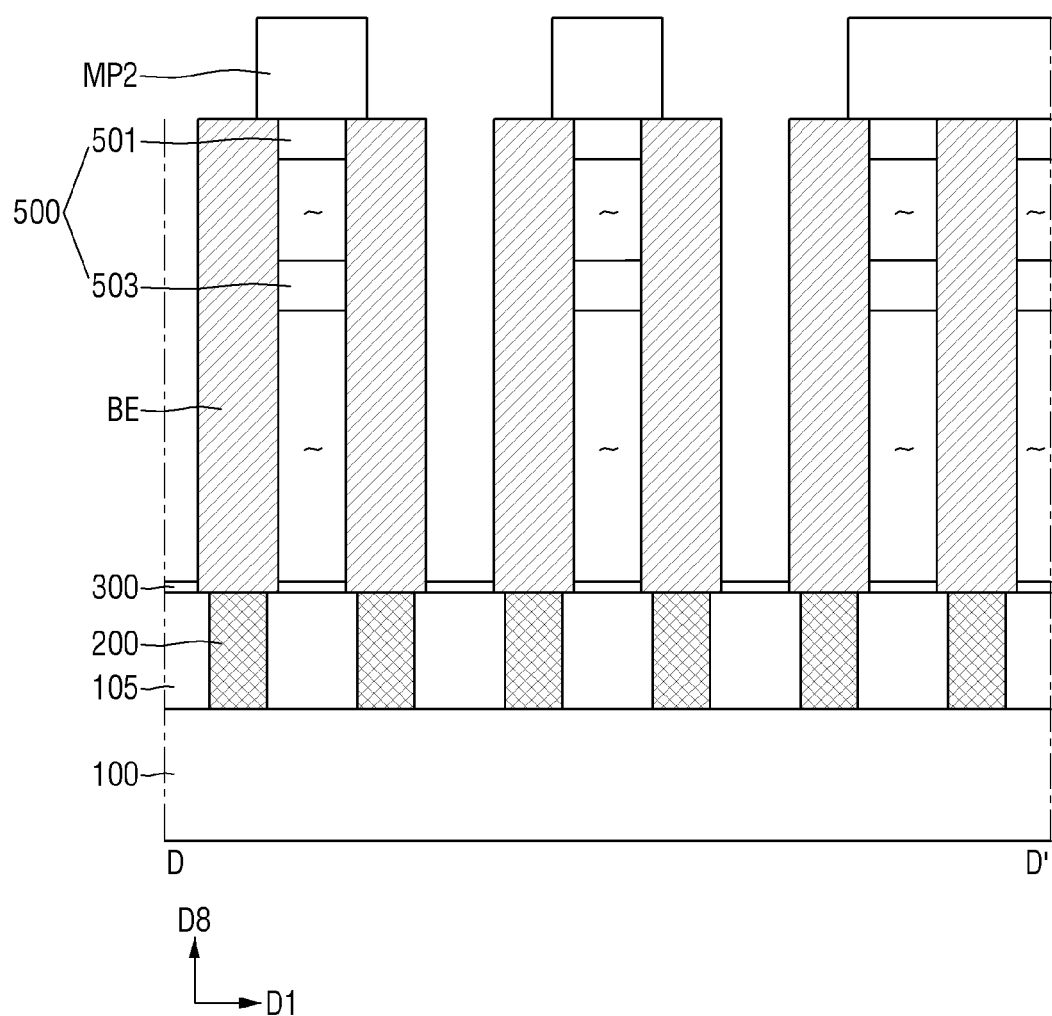

Referring to FIG. 15, the support pattern 500 which overlaps the second mask hole MH2 may be removed.

Further, the first mold layer ML1 and the second mold layer ML2 may be removed. A space defined by the side walls of the lower electrode BE, the lower surface of the lower support pattern 503, and the upper surface of the etching stopping film 300 may be an empty space. A space defined by the lower surface of the upper support pattern 501, the upper surface of the lower support pattern 503, and the side walls of the lower electrode BE may be an empty space.

The empty spaces may be spaces in which the capacitive dielectric film (e.g., 400 of FIG. 16) and the upper electrode (e.g., 600 of FIG. 16) are formed in a process to be described later.

Figure 16:
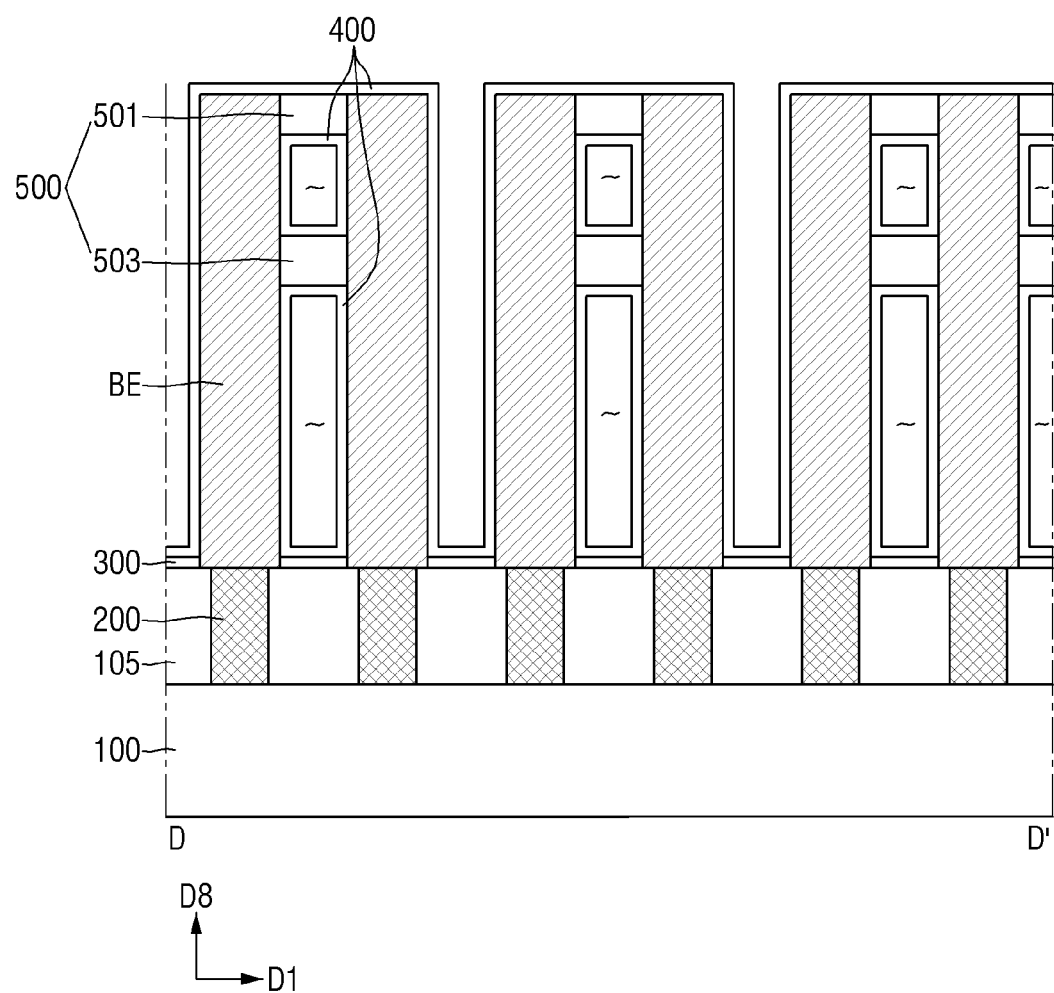

Referring to FIG. 16, the capacitive dielectric film 400 may be formed along the boundary between the lower electrode BE, the etching stopping film 300 and the upper support pattern 501.

The capacitive dielectric film 400 may be formed along the side walls of the lower electrode BE, the upper surface of the etching stopping film 300, and the lower surface of the lower support pattern 503. The capacitive dielectric film 400 may be formed along the side walls of the lower electrode BE, the upper surface of the lower support pattern 503, and the lower surface of the upper support pattern 501.

Figure 17:
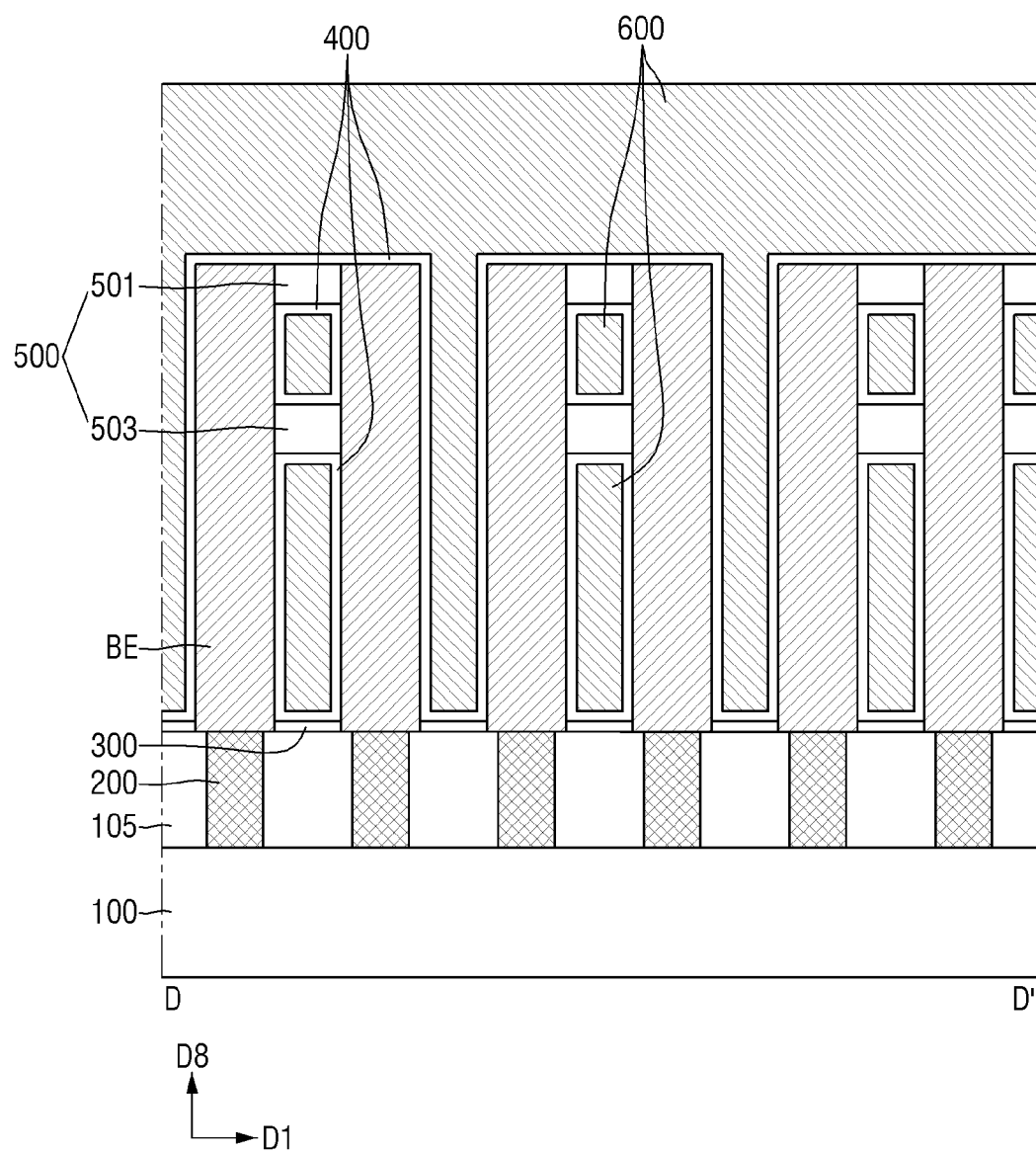

Referring to FIG. 17, the upper electrode 600 may be formed on the capacitive dielectric film 400.

The lower electrode BE, the capacitive dielectric film 400, and the upper electrode 600 may form capacitors of the semiconductor memory device according to some embodiments of the present disclosure.

Although the drawings only show that the lower electrode BE has a cylindrical shape, the technical ideas of the present disclosure are not limited thereto, and the lower electrode BE may include a pillar shape or other shapes.

In concluding the detailed description, those skilled in the art will appreciate that many variations and modifications may be made to the embodiments without substantially departing from the principles of the present disclosure. Therefore, the disclosed embodiments of the disclosure are used in a generic and descriptive sense only and not for purposes of limitation.

What is claimed is:

1. A semiconductor memory device comprising:
   a substrate;
   a first lower electrode group on the substrate and comprising a plurality of first lower electrodes;
   a second lower electrode group on the substrate and comprising a plurality of second lower electrodes;
   a first support pattern on side walls of each of the first lower electrodes and connecting each of the first lower electrodes; and
   a second support pattern on side walls of each of the second lower electrodes and connecting each of the second lower electrodes,
   wherein the plurality of first lower electrodes consists of six first edge lower electrodes arranged at respective vertices of a first hexagonal shape and free of electrodes between the respective vertices of the first hexagonal shape, and one first center lower electrode that is centrally positioned within the first hexagonal shape,
   the plurality of second lower electrodes consists of six second edge lower electrodes arranged at respective vertices of a second hexagonal shape and free of electrodes between the respective vertices of the second hexagonal shape, and one second center lower electrode that is centrally positioned within the second hexagonal shape,
   the first center lower electrode is spaced apart from each of the first edge lower electrodes, without electrodes therebetween, in first, second, and third directions that are different from each other,
   the first support pattern is immediately adjacent to the second support pattern, and
   the first center lower electrode is spaced apart from the second center lower electrode in a fourth direction that is different from the first, second, and third directions.

2. The semiconductor memory device of claim 1, further comprising:
   a third lower electrode group on the substrate and comprising a plurality of third lower electrodes; and
   a third support pattern on side walls of each of the third lower electrodes and connecting each of the third lower electrodes,
   wherein the third support pattern is immediately adjacent to the first and second support patterns,
   the plurality of third lower electrodes consists of six third edge lower electrodes arranged at respective vertices of a third hexagonal shape and free of electrodes between the respective vertices of the third hexagonal shape, and one third center lower electrode that is centrally positioned within the third hexagonal shape, and
   the third center lower electrode is spaced apart from the first center lower electrode in a fifth direction different from the first, second, third, and fourth directions.

3. The semiconductor memory device of claim 2, wherein the third center lower electrode is spaced apart from the second center lower electrode in a sixth direction different from the first, second, third, fourth, and fifth directions.

4. The semiconductor memory device of claim 2, wherein respective distances between the first and second center lower electrodes, between the second and third center lower electrodes, and between the first and third center lower electrodes are the same.

5. The semiconductor memory device of claim 1, wherein the first support pattern comprises a first upper support pattern spaced apart from the substrate in a thickness direction of the substrate, and a first lower support pattern between the first upper support pattern and the substrate in the thickness direction.

6. The semiconductor memory device of claim 5, wherein an upper surface of the first upper support pattern and an upper surface of the first lower electrodes are substantially coplanar.

7. The semiconductor memory device of claim 1, further comprising:
   a capacitive dielectric film extending along a profile of the first lower electrodes;
   and an upper electrode on the capacitive dielectric film.

8. A semiconductor memory device comprising:
   a substrate comprising a cell region, wherein the cell region comprises a first region and a second region along a boundary of the first region;
   a plurality of support patterns on the first region of the cell region and spaced apart from each other;
   a dummy support pattern extending along the second region of the cell region, wherein the first region of the cell region is free of the dummy support pattern;
   a plurality of lower electrodes on the first region of the cell region, wherein respective subsets of the lower electrodes are connected by each of the support patterns; and
   a plurality of dummy lower electrodes on the second region of the cell region of the substrate and connected by the dummy support pattern,
   wherein the support patterns are arranged in a honeycomb structure, and
   wherein the respective subsets of the lower electrodes consist of six edge lower electrodes arranged along a periphery of each of the support patterns at respective vertices of a hexagonal shape and free of electrodes between the respective vertices, and one center lower electrode that is centrally positioned within the periphery, wherein respective distances between the center lower electrode and each of the edge lower electrodes are the same.

9. The semiconductor memory device of claim 8, wherein a part of the dummy lower electrodes are arranged along the boundary between the first region of the cell region and the second region of the cell region.

10. The semiconductor memory device of claim 8, wherein the lower electrodes are not in contact with the dummy support pattern.

11. The semiconductor memory device of claim 8, wherein the center lower electrode is centrally positioned within the hexagonal shape without electrodes between the center lower electrode and the edge lower electrodes.

12. The semiconductor memory device of claim 8, wherein the support patterns comprise an upper support pattern spaced apart from the substrate in a thickness direction of the substrate, and a lower support pattern between the upper support pattern and the substrate in the thickness direction.

13. The semiconductor memory device of claim 8, further comprising:
    a capacitive dielectric film extending along a profile of the lower electrodes; and
    an upper electrode on the capacitive dielectric film.

14. A semiconductor memory device comprising:
    a substrate;
    a plurality of lower electrodes on the substrate; and
    a plurality of support patterns connected to the lower electrodes,
    wherein the plurality of lower electrodes comprises a first lower electrode line and a second lower electrode line extending in a first direction,
    wherein each of the first and second lower electrode lines are adjacent to each other in a second direction different from the first direction,
    wherein one of the lower electrodes of the second lower electrode line is offset in the second direction with respect to one of the lower electrodes of the first lower electrode line, and
    wherein the plurality of support patterns comprises a first support pattern line extending in a third direction different from the first direction and the second direction,
    wherein respective subsets of lower electrodes consist of six edge lower electrodes arranged along a periphery of each of the support patterns at respective vertices of a hexagonal shape and free of electrodes between the respective vertices, and one center lower electrode that is centrally positioned within the periphery without electrodes between the central lower electrode and the edge lower electrodes, and wherein respective distances between the center lower electrode and each of the edge lower electrodes are the same.

15. The semiconductor memory device of claim 14, wherein the support patterns are arranged in a honey-comb structure, and
    wherein the center lower electrode is centrally positioned within the hexagonal shape.

16. The semiconductor memory device of claim 14, wherein the support patterns comprise an upper support pattern spaced apart from the substrate in a thickness direction of the substrate, and a lower support pattern between the upper support pattern and the substrate in the thickness direction.

17. The semiconductor memory device of claim 14, wherein:
    the plurality of support patterns further comprises a second support pattern line extending in the third direction;
    the first and second support pattern lines are adjacent to each other in a fourth direction different from the first, second, and third directions; and
    a center of the first support pattern line and a center of the second support pattern line are offset from each other in the fourth direction.

* * * * *